United States Patent
Kubo

(10) Patent No.: US 10,951,164 B2
(45) Date of Patent: Mar. 16, 2021

(54) VOLTAGE-CONTROLLED OSCILLATOR, PLL CIRCUIT, AND CDR DEVICE

(71) Applicant: THINE ELECTRONICS, INC., Tokyo (JP)

(72) Inventor: Shunichi Kubo, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 16/520,579

(22) Filed: Jul. 24, 2019

(65) Prior Publication Data

US 2020/0036328 A1 Jan. 30, 2020

(30) Foreign Application Priority Data

Jul. 25, 2018 (JP) .............................. JP2018-139140

(51) Int. Cl.
| | | |
|---|---|---|
| H03B 5/12 | (2006.01) | |
| H03L 7/08 | (2006.01) | |
| H03L 7/099 | (2006.01) | |
| H02M 3/07 | (2006.01) | |
| H04L 7/033 | (2006.01) | |
| H03L 7/093 | (2006.01) | |

(52) U.S. Cl.
CPC ............ *H03B 5/1212* (2013.01); *H02M 3/07* (2013.01); *H03L 7/0807* (2013.01); *H03L 7/093* (2013.01); *H03L 7/099* (2013.01); *H04L 7/0331* (2013.01); *H03B 2201/0208* (2013.01)

(58) Field of Classification Search
CPC ............. H02M 3/07; H03B 2201/0208; H03B 5/1212; H03L 7/0807; H03L 7/093

USPC .......................................................... 375/355
See application file for complete search history.

(56) References Cited

U.S. PATENT DOCUMENTS

| | | | | |
|---|---|---|---|---|
| 4,272,736 A | * | 6/1981 | Gercekci | H03L 3/00 331/108 B |
| 5,838,512 A | * | 11/1998 | Okazaki | G11B 5/012 360/51 |
| 7,446,617 B2 | * | 11/2008 | Jang | H03B 19/14 331/117 FE |
| 8,717,112 B2 | * | 5/2014 | Chang | H03B 5/1228 331/117 FE |
| 9,680,479 B1 | * | 6/2017 | Chang | H03B 5/1243 |

(Continued)

FOREIGN PATENT DOCUMENTS

EP 1237283 B1 11/2008

*Primary Examiner* — Shuwang Liu
*Assistant Examiner* — Gina M McKie
(74) *Attorney, Agent, or Firm* — Sughrue Mion, PLLC

(57) ABSTRACT

Provided is a voltage-controlled oscillator capable of suppressing performance deterioration due to a leak current of a variable capacitive element. Each of the first capacitive circuit and the second capacitive circuit includes a variable capacitive element, a capacitive element, a detection circuit, and a compensation circuit. The variable capacitive element is provided between nodes. A capacitance value of variable capacitive element depends on a voltage value between the nodes. The detection circuit applies a bias voltage value to the second node, and detects an amount of leak current flowing through the variable capacitive element. The compensation circuit causes a current for compensating for the leak current of the variable capacitive element to flow through the first node on the basis of a detection result of the detection circuit.

16 Claims, 27 Drawing Sheets

(56) References Cited

U.S. PATENT DOCUMENTS

| | | | |
|---|---|---|---|
| 2003/0007586 A1* | 1/2003 | Ishii | H03L 7/0807 375/376 |
| 2005/0184357 A1* | 8/2005 | Chiba | H01L 27/0641 257/531 |
| 2011/0156760 A1* | 6/2011 | Bhuiyan | H03L 1/02 327/102 |

* cited by examiner

Compensation Circuit

Detection Circuit

Compensation Circuit

Detection Circuit

49
Compensation Circuit

48
Detection Circuit

49
Compensation
Circuit

48
Detection
Circuit

Compensation Circuit

Detection Circuit

VOLTAGE-CONTROLLED OSCILLATOR, PLL CIRCUIT, AND CDR DEVICE

TECHNICAL FIELD

The present invention relates to a voltage-controlled oscillator, a PLL circuit, and a CDR device.

BACKGROUND

A voltage-controlled oscillator (VCO) can output an oscillation signal having a frequency according to an input control voltage value. The voltage-controlled oscillator is used as an important component in a phase locked loop (PLL) circuit, a clock data recovery (CDR) device, or the like. There are various types of voltage-controlled oscillators. Among them, an LC-VCO includes an inductor, and a capacitor of which a capacitance value changes under voltage control, and outputs an oscillation signal having a frequency according to an input control voltage value due to a resonance phenomenon of the inductor and the capacitor. An LC-VCO has less jitter than other types of voltage-controlled oscillators. Accordingly, in the case of frequencies of 10 Gbps or higher, use of the LC-VCO among various types of voltage-controlled oscillators is essential.

The LC-VCO includes, as a capacitor involved in the resonance phenomenon, a capacitive element of which a capacitance value changes according to a voltage value applied between two terminals. Such a capacitive element is called a varicap diode, a varactor diode, or a variable capacitance diode.

In the present specification, such a capacitive element is referred to as a "variable capacitive element." For example, the variable capacitive element is configured using a diode having a $P^+$ region in which high-concentration P type impurities have been injected into an N well into which low-concentration N type impurities have been injected through a CMOS process. Further, for example, the variable capacitive element is configured using a MOS transistor having two $N^+$ regions in which high-concentration N-type impurities have been injected into a P well into which low-concentration P-type impurities have been injected.

Generally, the variable capacitive element not only has a capacitance value according to an applied voltage value, but also generates a leak current of an amount according to the voltage value. Jitter may be caused in the oscillation signal output from the LC-VCO due to the leak current of the variable capacitive element, and the performance of the LC-VCO may deteriorate. When the performance of the LC-VCO deteriorates, the performance of the PLL circuit or the CDR device using the LC-VCO also deteriorates.

Patent Document 1 discloses an invention intended to solve such a problem. The invention disclosed in this document includes a replica circuit separately from the LC-VCO. The replica circuit includes a variable capacitive element that is the same as that of the LC-VCO, and also includes a differential amplifier and a current mirror circuit. The invention is intended to suppress the performance deterioration of an LC-VCO by compensating for a leak current of a variable capacitive element of an LC-VCO using a leak current of a variable capacitive element of a replica circuit.

PRIOR ART DOCUMENT

Patent Document

[Patent Document 1] European Patent No. 1237283

SUMMARY

However, in the invention disclosed in Patent Document 1, when characteristics of the variable capacitive element of the LC-VCO and the variable capacitive element of the replica circuit are different, the leak currents flowing through the variable capacitive elements are different and sufficient compensation cannot be performed. Therefore, the performance deterioration of the LC-VCO cannot be sufficiently suppressed, and the performance deterioration of the PLL circuit or the CDR device using the LC-VCO cannot also be sufficiently suppressed. Further, in the invention disclosed in Patent Document 1, a layout area of the variable capacitive element of the replica circuit increases when the variable capacitive element of the replica circuit is integrated on a semiconductor substrate.

The present invention has been made to solve the above problems, and an object of the present invention is to provide a voltage-controlled oscillator capable of suppressing the performance deterioration due to a leak current of a variable capacitive element and suppressing an increase in a layout area. Another object of the present invention is to provide a PLL circuit and a CDR device capable of suppressing the performance deterioration due to a leak current of a variable capacitive element of an LC-VCO.

A voltage-controlled oscillator of the present invention includes an inductor, a first capacitive circuit, and a second capacitive circuit, and outputs an oscillation signal having a frequency according to an input control voltage value due to a resonance phenomenon of the inductor, the first capacitive circuit, and the second capacitive circuit. In the voltage-controlled oscillator, each of the first capacitive circuit and the second capacitive circuit includes a variable capacitive element provided between a node N1 and a node N2 and having a capacitance value according to a voltage value between the nodes; a capacitive element provided between the node N2 and a node N3; a detection circuit that applies a bias voltage value to the node N2 and detects an amount of leak current flowing through the variable capacitive element; and a compensation circuit that causes a current for compensating for the leak current to flow through the node N1 on the basis of a detection result of the detection circuit. Further, the inductor is provided between the nodes N3 of the first capacitive circuit and the second capacitive circuit, and the nodes N1 of the first capacitive circuit and the second capacitive circuit are electrically connected to each other to receive the control voltage value.

It is preferable for the voltage-controlled oscillator of the present invention to further include a third capacitive circuit connected to the node N3 of each of the first capacitive circuit and the second capacitive circuit and having a capacitance value that is set by a control signal.

In the voltage-controlled oscillator of the present invention, it is preferable for the detection circuit of each of the first capacitive circuit and the second capacitive circuit to be common, and it is preferable for the compensation circuit of each of the first capacitive circuit and the second capacitive circuit to be common.

In the voltage-controlled oscillator of the present invention, it is preferable for the detection circuit to include (1) a MOS transistor M1 of which a source is connected to a first potential supply terminal, (2) a resistive unit provided between a drain of the MOS transistor M1 and the node N2, and (3) a differential amplifier including a first input terminal connected to the drain of the MOS transistor M1, a second input terminal to which a bias voltage value is input, and an output terminal connected to a gate of the MOS transistor M1. Further, it is preferable for the compensation circuit to include (1) a MOS transistor M2 of which a source is connected to the first potential supply terminal and a gate is connected to the output terminal of the differential amplifier, (2) a MOS transistor M3 provided between a second potential supply terminal and a drain of the MOS transistor M2, and (3) a MOS transistor M4 that is provided between the second potential supply terminal and the node N1, that forms a current mirror circuit together with the MOS transistor M3, and through which a current of the same amount as a current flowing through the MOS transistor M3 flows.

It should be noted that one of the first potential supply terminal and the second potential supply terminal is a high potential supply terminal, and the other is a low potential supply terminal. When the first potential supply terminal is the high potential supply terminal and the second potential supply terminal is the low potential supply terminal, the MOS transistors M1 and M2 of which a source is connected to the high potential supply terminal are PMOS transistors, and the MOS transistors M3 and M4 of which a source is connected to the low potential supply terminal are NMOS transistors. On the other hand, when the first potential supply terminal is the low potential supply terminal and the second potential supply terminal is the high potential supply terminal, the MOS transistors M1 and M2 of which a source is connected to the low potential supply terminal are NMOS transistors, and the MOS transistors M3 and M4 of which a source is connected to the high potential supply terminal are PMOS transistors.

In the voltage-controlled oscillator of the present invention, it is preferable for the detection circuit to further include a first current source provided between the second potential supply terminal and the drain of the MOS transistor M1. Further, it is preferable for the detection circuit to further include a second current source provided between the second potential supply terminal and the node N2.

In the voltage-controlled oscillator of the present invention, it is preferable for the compensation circuit to further include a third current source provided between the first potential supply terminal and the node N1. Further, it is preferable for the compensation circuit to further include a fourth current source provided between the second potential supply terminal and a gate of each of the MOS transistor M3 and the MOS transistor M4.

In the voltage-controlled oscillator of the present invention, it is preferable for the detection circuit to include (1) a MOS transistor M11 of which a source is connected to a first potential supply terminal, (2) a MOS transistor M21 of which a source is connected to a second potential supply terminal, (3) a resistive unit provided between a drain of each of the MOS transistor M11 and the MOS transistor M21 and the node N2, (4) a differential amplifier including a first input terminal connected to the drain of each of the MOS transistor M11 and the MOS transistor M21, a second input terminal to which a bias voltage value is input, and an output terminal connected to a gate of each of the MOS transistor M11 and the MOS transistor M21. Further, it is preferable for the compensation circuit to include (1) a MOS transistor M12 of which a source is connected to the first potential supply terminal and a gate is connected to the output terminal of the differential amplifier, (2) a MOS transistor M13 provided between the second potential supply terminal and a drain of the MOS transistor M12, (3) a MOS transistor M14 that is provided between the second potential supply terminal and the node N1, that constitutes a current mirror circuit together with the MOS transistor M13, and through which a current of the same amount as a current flowing through the MOS transistor M13 flows; (4) a MOS transistor M22 of which a source is connected to the second potential supply terminal and a gate is connected to the output terminal of the differential amplifier; (5) a MOS transistor M23 provided between the first potential supply terminal and a drain of the MOS transistor M22, and (6) a MOS transistor M24 that is provided between the first potential supply terminal and the node N1, that constitutes a current mirror circuit together with the MOS transistor M23, and through which a current of the same amount as a current flowing through the MOS transistor M23 flows.

It should be noted that one of the first potential supply terminal and the second potential supply terminal is a high potential supply terminal, and the other is a low potential supply terminal. When the first potential supply terminal is the high potential supply terminal and the second potential supply terminal is the low potential supply terminal, the MOS transistors M11, M12, M23, and M24 of which a source is connected to the high potential supply terminal are PMOS transistors, and the MOS transistors M21, M22, M13, and M14 of which a source is connected to the low potential supply terminal are NMOS transistors. On the other hand, when the first potential supply terminal is the low potential supply terminal and the second potential supply terminal is the high potential supply terminal, the MOS transistors M11, M12, M23, and M24 of which a source is connected to the low potential supply terminal are NMOS transistors, and the MOS transistors M21, M22, M13, and M14 of which a source is connected to the high potential supply terminal are PMOS transistors. Further, one of the first input terminal and the second input terminal of the differential amplifier is an inverting input terminal, and the other is a non-inverting input terminal.

In the voltage-controlled oscillator of the present invention, it is preferable for the detection circuit to include, as the resistive unit, a MOS transistor M5 having a resistance value corresponding to a gate voltage.

A PLL circuit according to the present invention includes (1) the voltage-controlled oscillator of the present invention, which outputs an oscillation signal having a frequency according to an input control voltage value, (2) a phase comparator that receives an oscillation signal output from the voltage-controlled oscillator or a signal obtained by dividing the oscillation signal as a feedback oscillation signal, also receives an input signal, detects a phase difference between the feedback oscillation signal and the input signal, and outputs a phase difference signal indicating this phase difference, (3) a charge pump that receives a phase difference signal output from the phase comparator and outputs a charge/discharge current according to the phase difference indicated by the phase difference signal, and (4) a loop filter that receives a charge/discharge current output from the charge pump and outputs the control voltage value that is increased/decreased according to a charge/discharge amount thereof to the voltage-controlled oscillator.

It is preferable for the PLL circuit of the present invention to include a plurality of voltage-controlled oscillators as the voltage-controlled oscillator, and a selection unit that selects and outputs an oscillation signal output from any one of the plurality of voltage-controlled oscillators.

In the PLL circuit of the present invention, it is preferable for the voltage-controlled oscillator other than the voltage-controlled oscillator selected from among the plurality of voltage-controlled oscillators by the selection unit to receive the control voltage value instead of the bias voltage value.

A CDR device of the present invention receives a digital signal in which a clock has been embedded, recovers data and the clock on the basis of the digital signal, and outputs the recovered data and the recovered clock. The CDR device of the present invention includes: (1) a sampler that samples data of the digital signal at a timing indicated by the recovered clock, and outputs the sampled data as the recovered data in synchronization with the recovered clock; and (2) the PLL circuit of the present invention that inputs the recovered data to the phase comparator as an input signal, outputs the recovered clock from the voltage-controlled oscillator as the oscillation signal, and applies the recovered clock to the sampler.

A capacitive circuit of the present invention includes a variable capacitive element provided between a node N1 and a node N2 and having a capacitance value according to a voltage value between the nodes; a capacitive element provided between the node N2 and a node N3; a detection circuit that applies a bias voltage value to the node N2 and detects an amount of leak current flowing through the variable capacitive element; and a compensation circuit that causes a current for compensating for the leak current to flow through the node N1 on the basis of a detection result of the detection circuit, The LC-VCO of the present invention can suppress the performance deterioration due to the leak current of the variable capacitive element, and can suppress an increase in the layout area.

DETAILED DESCRIPTION

Hereinafter, modes for carrying out the present invention will be described in detail with reference to the accompanying drawings. It should be noted that in the description of the drawings, the same elements will be denoted by the same reference signs and redundant description will be omitted. The present invention is not limited to examples thereof but is shown by the claims, and is intended to include all modifications within the meaning and scope equivalent to the claims.

Figure 1:
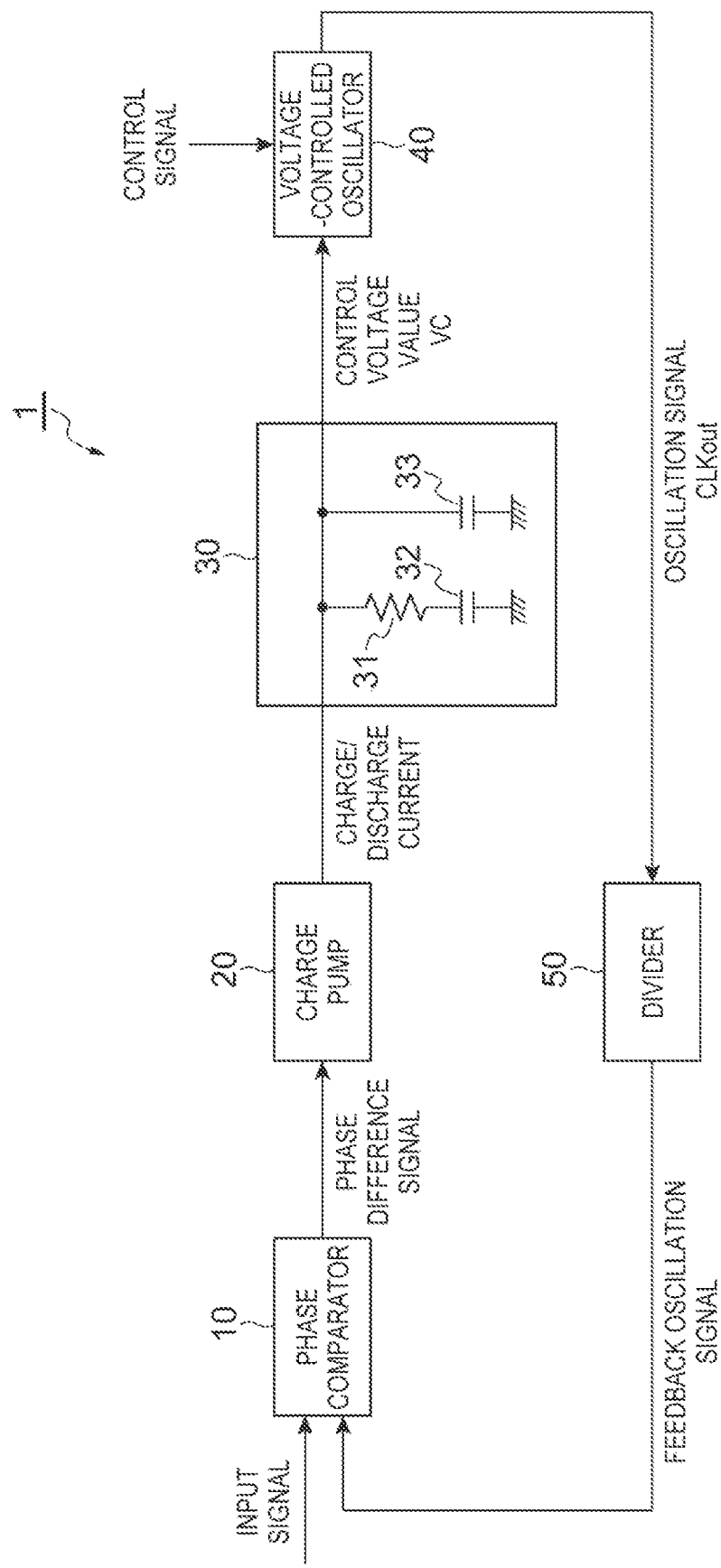
FIG. 1 is a diagram illustrating a configuration of a PLL circuit 1.

FIG. 1 is a diagram illustrating a configuration of a PLL circuit 1. The PLL circuit 1 includes a phase comparator 10, a charge pump 20, a loop filter 30, a voltage-controlled oscillator 40, and a divider 50. The loop filter 30 includes a resistor 31, a capacitive element 32 and a capacitive element 33.

The phase comparator 10 receives a feedback oscillation signal output from the divider 50 and also receives an input signal. The input signal may be a reference oscillation signal of which a frequency is constant, or may be a digital signal of which a period of time of each bit is constant. The phase comparator 10 detects a phase difference between the feedback oscillation signal and the input signal, and outputs a phase difference signal indicating this phase difference to the charge pump 20. The phase difference signal indicates which of the feedback oscillation signal and the input signal advances in phase.

The charge pump 20 receives the phase difference signal output from the phase comparator 10 and outputs a charge/discharge current according to the phase difference indicated by the phase difference signal to the loop filter 30. The charge/discharge current output from the charge pump 20 to the loop filter 30 differs in polarity according to which of the reference oscillation signal and the input signal advances in phase. The loop filter 30 receives the charge/discharge current output from the charge pump 20, and outputs a control voltage value VC that is increased or decreased according to a charge/discharge amount to the voltage-controlled oscillator 40.

The loop filter 30 includes a resistor 31 that receives the charge/discharge current output from the charge pump 20 at a first terminal, a capacitive element 32 provided between a second terminal of the resistor 31 and a ground potential end, and a capacitive element 33 provided between the first terminal of the resistor 31 and the ground potential end. An output terminal of the charge pump 20 and an input terminal of the voltage-controlled oscillator 40 are connected to the first terminal of the resistor 31 of the loop filter 30.

The voltage-controlled oscillator 40 receives the control voltage value VC output from the loop filter 30, and outputs an oscillation signal CLKout having a frequency corresponding to the control voltage value VC. The divider 50 receives the oscillation signal output from the voltage-controlled oscillator 40, divides the oscillation signal by N to generate a feedback oscillation signal, and outputs the feedback oscillation signal to the phase comparator 10.

The phase comparator 10, the charge pump 20, the loop filter 30, the voltage-controlled oscillator 40 and the divider 50 constitute a loop. In this loop, a charge/discharge current is input from the charge pump 20 to the loop filter 30 so that the phase difference between the feedback oscillation signal input to the phase comparator 10 and the input signal is reduced. In a state in which the operation of this loop is stable, the oscillation signal output from the voltage-controlled oscillator 40 has a frequency that is N times the frequency of the input signal. It should be noted that the divider 50 may not be provided, and in this case, the oscillation signal output from the voltage-controlled oscillator 40 has the same frequency as a frequency of the reference oscillation signal, and a division ratio N=1.

Figure 2:
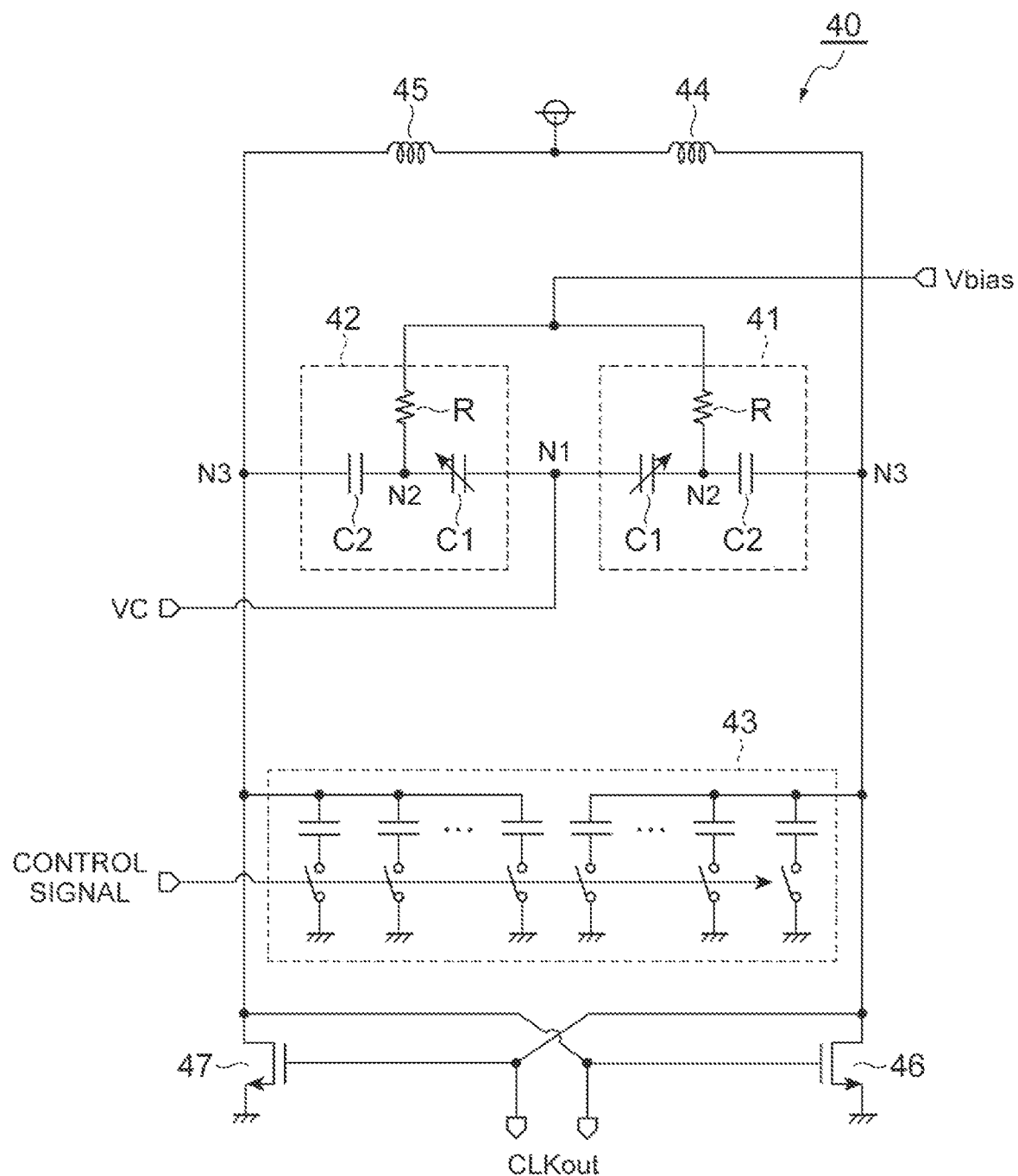
FIG. 2 is a diagram illustrating a circuit example of a voltage-controlled oscillator 40.

FIG. 2 is a diagram illustrating a circuit example of the voltage-controlled oscillator 40. The voltage-controlled oscillator 40 illustrated in FIG. 2 is an LC-VCO. The voltage-controlled oscillator 40 includes a first capacitive circuit 41, a second capacitive circuit 42, a third capacitive circuit 43, an inductor 44, an inductor 45, an NMOS transistor 46, and an NMOS transistor 47.

The first capacitive circuit 41 and the second capacitive circuit 42 have a common configuration. Each of the first capacitive circuit 41 and the second capacitive circuit 42 includes a variable capacitive element C1, a capacitive element C2, and a resistor R. The variable capacitive element C1 is provided between a node N1 and a node N2. A capacitance value of the variable capacitive element C1 depends on a voltage value between the node N1 and the node N2. The capacitive element C2 is provided between the node N2 and a node N3. A capacitance value of the capacitive element C2 may be constant regardless of the voltage value between the node N2 and the node N3. One terminal of the resistor R is connected to the node N2, and any bias voltage value Vbias is input to the other terminal of the resistor R. A resistance value of the resistor R is high, and any bias voltage value Vbias is applied to the node N2 of each of the first capacitive circuit 41 and the second capacitive circuit 42.

The third capacitive circuit 43 is connected to the node N3 of each of the first capacitive circuit 41 and the second capacitive circuit 42. The third capacitive circuit 43 includes a plurality of capacitive elements connected to the node N3 of the first capacitive circuit 41, and a switch connected in series corresponding to each of the plurality of capacitive elements. Further, the third capacitive circuit 43 also includes a plurality of capacitive elements connected to the node N3 of the second capacitive circuit 42, and a switch connected in series corresponding to each of the plurality of capacitive elements. In the third capacitive circuit 43, an ON/OFF state of each switch is set by a control signal provided from the outside, and the third capacitive circuit 43 has a capacitance value according to the settings.

The inductor 44 and the inductor 45 have common characteristics. The inductor 44 is provided between a power supply potential supply terminal and the node N3 of the first capacitive circuit 41. The inductor 45 is provided between the power supply potential supply terminal and the node N3 of the second capacitive circuit 42.

The NMOS transistor 46 and the NMOS transistor 47 have common characteristics. A drain of the NMOS transistor 46 is connected to the node N3 of the first capacitive circuit 41. A source of the NMOS transistor 46 is connected to the ground potential supply terminal. A gate of the NMOS transistor 46 is connected to a drain of the NMOS transistor 47. The drain of the NMOS transistor 47 is connected to the node N3 of the second capacitive circuit 42. A source of the NMOS transistor 47 is connected to the ground potential supply terminal. A gate of the NMOS transistor 47 is connected to the drain of the NMOS transistor 46.

The node N1 of each of the first capacitive circuit 41 and the second capacitive circuit 42 is common, and the control voltage value VC is input to the node N1. The oscillation signal CLKout is output from the node N3 of each of the first capacitive circuit 41 and the second capacitive circuit 42 (or a node electrically connected to the first capacitive circuit 41 and the second capacitive circuit 42).

Figure 3:
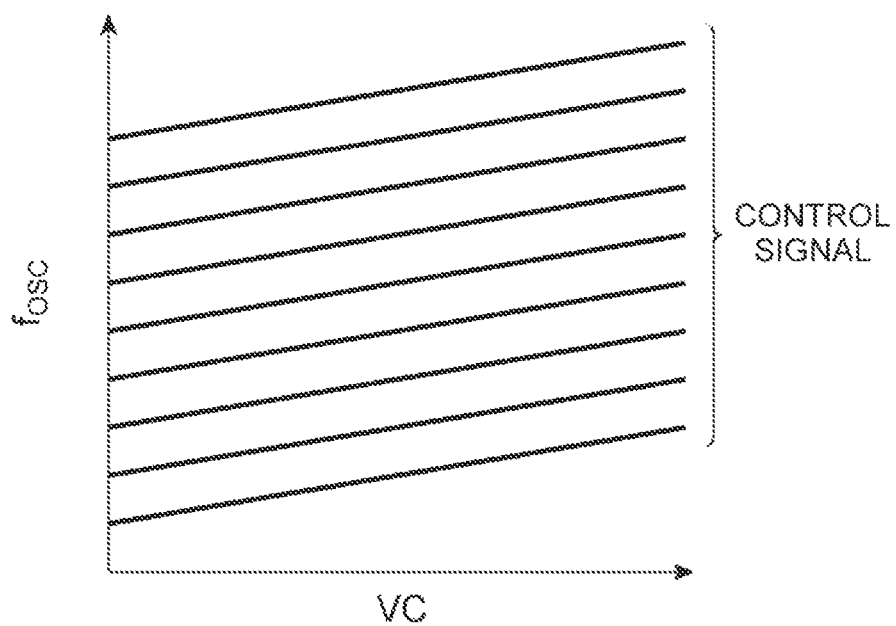
FIG. 3 is a diagram illustrating characteristics of a voltage-controlled oscillator 40.

FIG. 3 is a diagram illustrating characteristics of the voltage-controlled oscillator 40. In FIG. 3, a horizontal axis indicates the control voltage value VC that is input to the voltage-controlled oscillator 40. A vertical axis indicates a frequency $f_{OSC}$ of the oscillation signal CLKout that is output from the voltage-controlled oscillator 40. In FIG. 3, nine lines indicating a relationship (FV characteristic) between the control voltage value VC and the frequency of the oscillation signal CLKout are illustrated. By setting a capacitance value of the third capacitive circuit 43 using the control signal, it is possible to select any one of the nine FV characteristics. The oscillation signal CLKout having a frequency corresponding to the control voltage value VC in the selected FV characteristics is output from the voltage-controlled oscillator 40. It should be noted that it is not necessary to select one from a plurality of FV characteristics, and when the FV characteristics may be fixed, the third capacitive circuit 43 may not be provided.

Incidentally, in the variable capacitive element C1 included in each of the first capacitive circuit 41 and the second capacitive circuit 42 of the voltage-controlled oscillator 40, a leak current of an amount according to a voltage value applied between the node N1 and the node N2 is generated. The performance of the PLL circuit 1 deteriorates according to the amount of leak current.

For example, the variable capacitive element is configured using a MOS transistor having two $N^+$ regions in a P well through a fine CMOS process. When a source and a drain of the MOS transistor are electrically connected to each other and used as one terminal and a gate is used as the other terminal, a junction capacitance value of the MOS transistor corresponds to a voltage value that is applied between the two terminals. Further, a leak current of an amount according to the applied voltage value is generated between the two terminals. The leak current in this MOS transistor is called gate leakage. In recent years, gate leakage has become more apparent as processes have become finer and gate oxide films have become thinner.

Figure 4:
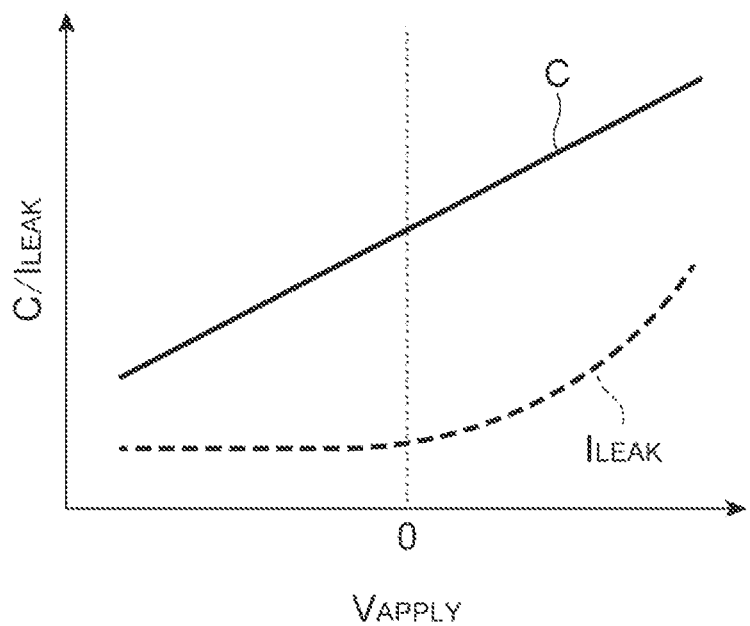
FIG. 4 is a diagram illustrating characteristics of a variable capacitive element.

FIG. 4 is a diagram illustrating characteristics of the variable capacitive element. A horizontal axis of the graph indicates an applied voltage value $V_{APPLY}$ between the two terminals, and a vertical axis indicates capacitance value C/amount of leak current $I_{LEAK}$. FIG. 4 illustrates a relationship between the applied voltage value $V_{APPLY}$ between the two terminals and the capacitance value C, and a relationship between the applied voltage value $V_{APPLY}$ between the two terminals and the amount of leak current $I_{LEAK}$. As illustrated in FIG. 4, when the applied voltage value $V_{APPLY}$ increases beyond 0, the amount of leak current $I_{LEAK}$ rapidly increases. It should be noted that the amount of leak current $I_{LEAK}$ changes greatly with temperature. Generally, the amount of leak current $I_{LEAK}$ is greater when the temperature is higher. The amount of leak current is, for example, several nA to tens of μA.

When a leak current is generated in the variable capacitive element C1 included in each of the first capacitive circuit 41 and the second capacitive circuit 42 of the voltage-controlled oscillator 40, this current flows in a direction from an input terminal for the bias voltage value Vbias to an input terminal for the control voltage value VC via the resistor R and the variable capacitive element C1 or in a direction opposite thereto. The direction in which the current flows differs according to a direction of the variable capacitive element C1, and the bias voltage value Vbias.

The amount of charge accumulated in the capacitive elements 32 and 33 of the loop filter 30 fluctuates due to the current regardless of the direction in which the current flows, and the control voltage value VC output from the loop filter 30 fluctuates. When the control voltage value VC input to the voltage-controlled oscillator 40 fluctuates, the frequency of the oscillation signal CLKout output from the voltage-controlled oscillator 40 also fluctuates, and the frequency of the feedback oscillation signal input to the phase comparator 10 also fluctuates.

In the phase comparator 10, the phase difference between the input signal and the feedback oscillation signal is detected. The charge/discharge current is input from the charge pump 20 to the loop filter 30 so that the phase difference is reduced. The charge/discharge current is, for example, about 10 μA or more. As the control voltage value VC returns to the original value, the frequency of the oscillation signal CLKout output from the voltage-controlled oscillator 40 also returns to an original frequency.

However, feedback in the PLL circuit 1 is performed for each period of the input signal, and therefore, when the period (or time per bit) of the input signal is long, a fluctuation range of the frequency of the oscillation signal CLKout during one period increases, and jitter of the oscillation signal CLKout increases. Further, when the amount of leak current of the variable capacitive element C1 is larger than the amount of charge/discharge current provided from the charge pump 20 to the loop filter 30, the control voltage value VC cannot return to the original value through feedback, and the PLL circuit does not work.

For example, the following two elements can be used as the variable capacitive element. One of the two elements has a thin gate oxide film and operates at a low voltage (1.0 V), the amount of change in capacitance is large, and the amount of leak current is relatively large. The other element has a thick gate oxide film and operates at a high voltage (3.3 V), the amount of change in capacitance is small, and the amount of leak current is relatively small. When the latter variable capacitive element operating at a high voltage is used, there is a method of increasing a control voltage range to increase a capacitance variable range. However, it is necessary for an operation at a high voltage of peripheral circuits such as the charge pump and the loop filter to be used, and a layout area increases when the variable capacitive element is integrated on a semiconductor substrate. Further, increasing a size of the variable capacitive element without increasing the control voltage range can be considered as a countermeasure, but in this case, the layout area also increases.

In the invention disclosed in Patent Document 1, the replica circuit including the variable capacitive element that is the same as the variable capacitive element of the LC-VCO is provided, and the leak current of the variable capacitive element of the LC-VCO is compensated for by the leak current of the variable capacitive element of the replica circuit, to achieve suppression of the performance deterioration of the LC-VCO. However, the layout area also increases in this case. Further, when characteristics are different between the variable capacitive element of the LC-VCO and the variable capacitive element of the replica circuit, the leak currents flowing through the respective variable capacitive elements are different and sufficient compensation cannot be performed. Therefore, the performance deterioration of the LC-VCO cannot be sufficiently suppressed, and the performance deterioration of the PLL circuit or the CDR device using the LC-VCO cannot be sufficiently suppressed.

Figure 5:
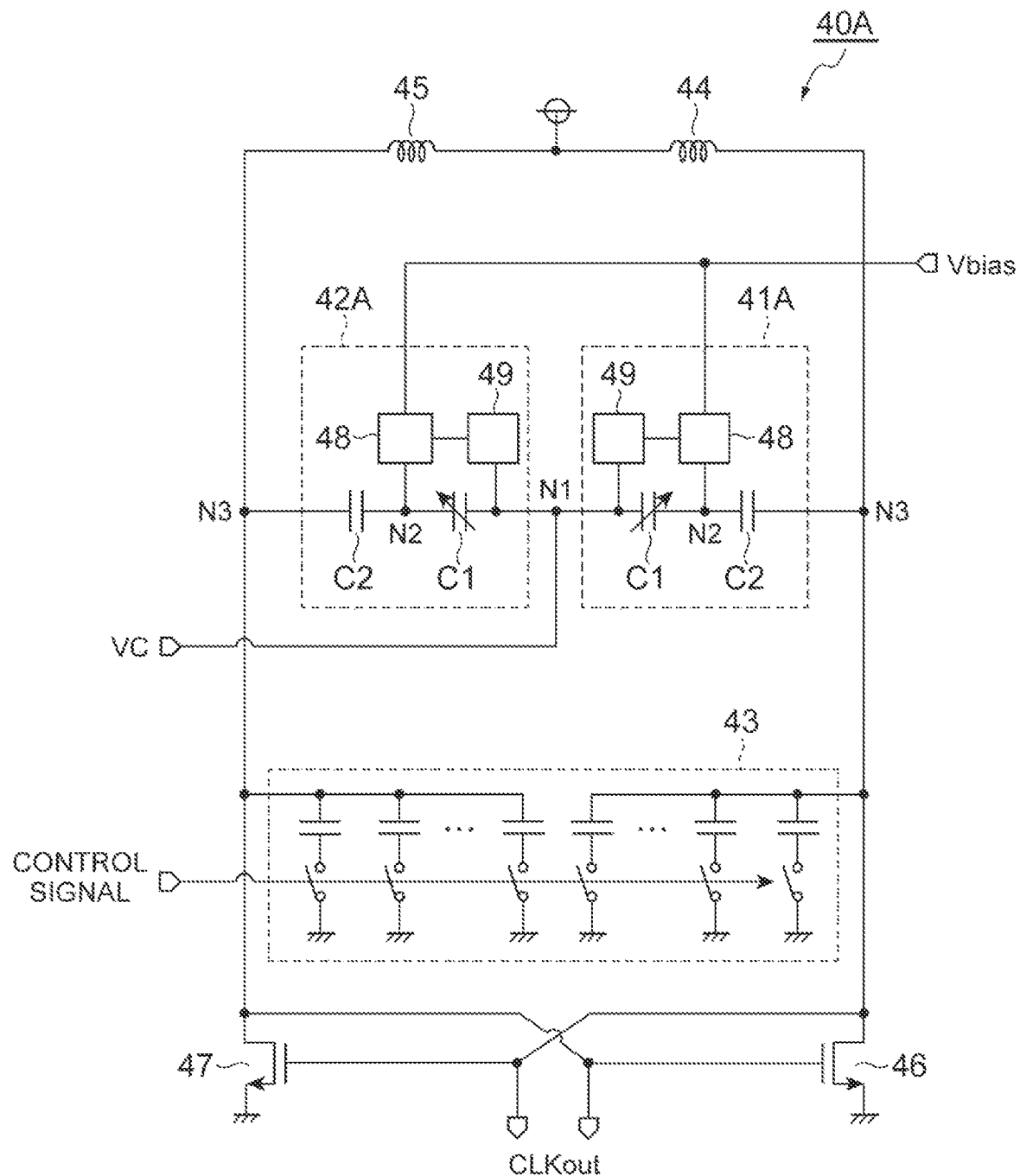
FIG. 5 is a diagram illustrating a configuration of a voltage-controlled oscillator 40A.

Embodiments to be described below can solve such problems. FIG. 5 is a diagram illustrating a configuration of the voltage-controlled oscillator 40A. The voltage-controlled oscillator 40A illustrated in FIG. 5 includes a first capacitive circuit 41A, a second capacitive circuit 42A, a third capacitive circuit 43, an inductor 44, an inductor 45, an NMOS transistor 46, and an NMOS transistor 47. The voltage-controlled oscillator 40A illustrated in FIG. 5 is different from the configuration of the voltage-controlled oscillator 40 illustrated in FIG. 2 in that the first capacitive circuit 41A is included instead of the first capacitive circuit 41, and the second capacitive circuit 42A is included instead of the second capacitive circuit 42.

The first capacitive circuit 41A and the second capacitive circuit 42A have a common configuration. Each of the first capacitive circuit 41A and the second capacitive circuit 42A includes a variable capacitive element C1, a capacitive element C2, a detection circuit 48, and a compensation circuit 49. The variable capacitive element C1 is provided between a node N1 and a node N2. A capacitance value of the variable capacitive element C1 depends on a voltage value between the node N1 and the node N2. The capacitive element C2 is provided between the node N2 and a node N3. The capacitance value of capacitive element C2 may be constant regardless of the voltage value between the node N2 and the node N3. The detection circuit 48 applies a bias voltage value Vbias to the node N2, and detects an amount of leak current flowing through the variable capacitive element C1. The compensation circuit 49 causes a current for compensating for the leak current of the variable capacitive element C1 to flow through the node N1 on the basis of a detection result of the detection circuit 48.

Figure 6:
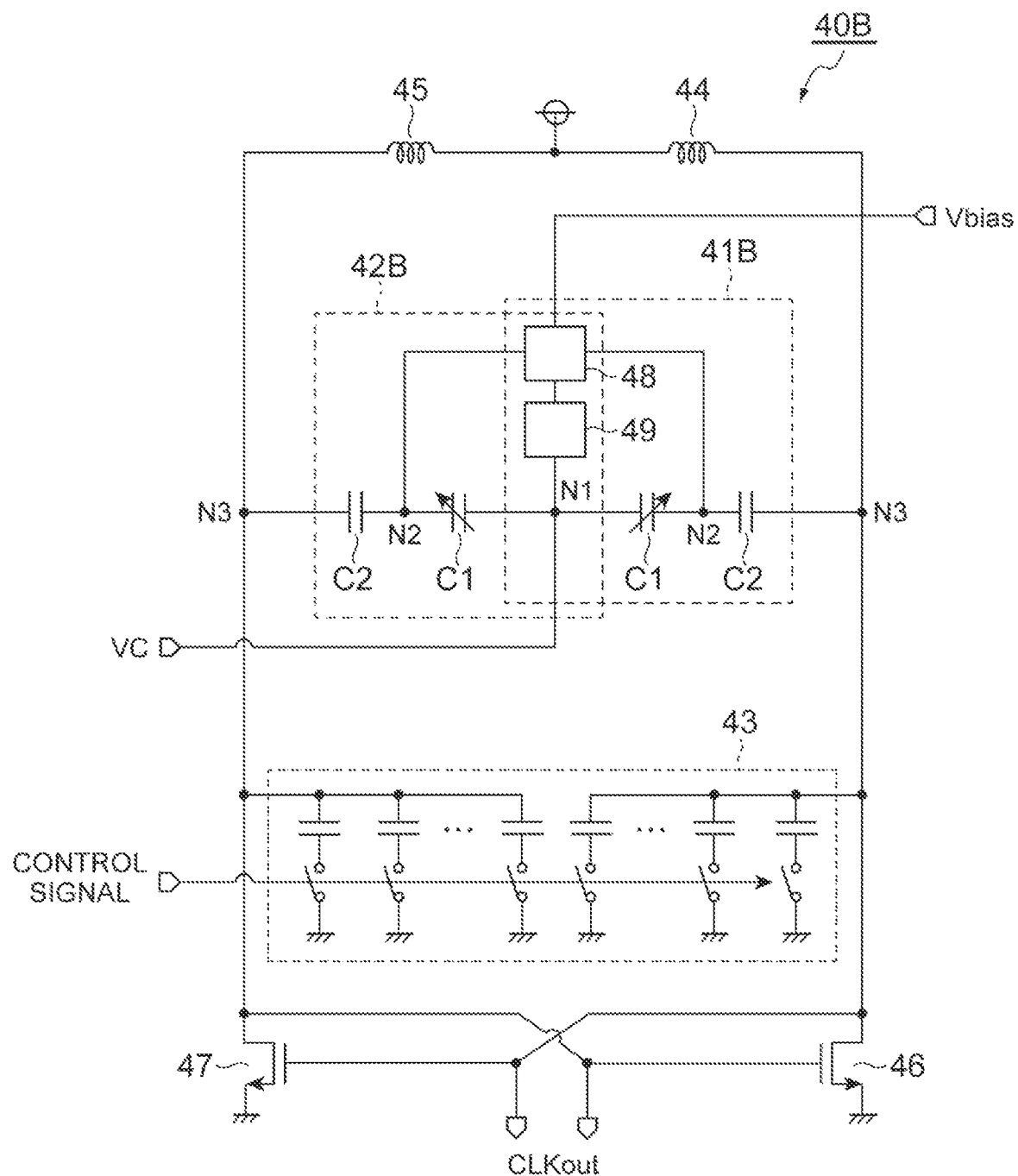
FIG. 6 is a diagram illustrating a configuration of a voltage-controlled oscillator 40B.

FIG. 6 is a diagram illustrating a configuration of a voltage-controlled oscillator 40B. The voltage-controlled oscillator 40B illustrated in FIG. 6 includes a first capacitive circuit 41B, a second capacitive circuit 42B, a third capacitive circuit 43, an inductor 44, an inductor 45, an NMOS transistor 46, and an NMOS transistor 47. The voltage-controlled oscillator 40B illustrated in FIG. 6 is different from the configuration of the voltage-controlled oscillator 40A illustrated in FIG. 5 in that the voltage-controlled oscillator 40B includes the first capacitive circuit 41B instead of the first capacitive circuit 41A and includes the second capacitive circuit 42B instead of the second capacitive circuit 42A.

The first capacitive circuit 41B and the second capacitive circuit 42B have a common configuration. Each of the first capacitive circuit 41B and the second capacitive circuit 42B includes a variable capacitive element C1, a capacitive element C2, a detection circuit 48, and a compensation circuit 49. In this configuration, the detection circuit 48 of each of the first capacitive circuit 41B and the second capacitive circuit 42B is common. Further, the compensation circuit 49 of each of the first capacitive circuit 41B and the second capacitive circuit 42B is common.

It should be noted that, in each of the voltage-controlled oscillator 40A (FIG. 5) and the voltage-controlled oscillator 40B (FIG. 6), it is not necessary to select one from a plurality of FV characteristics, and when the FV characteristics may be fixed, the third capacitive circuit 43 may not be provided.

Figure 7:
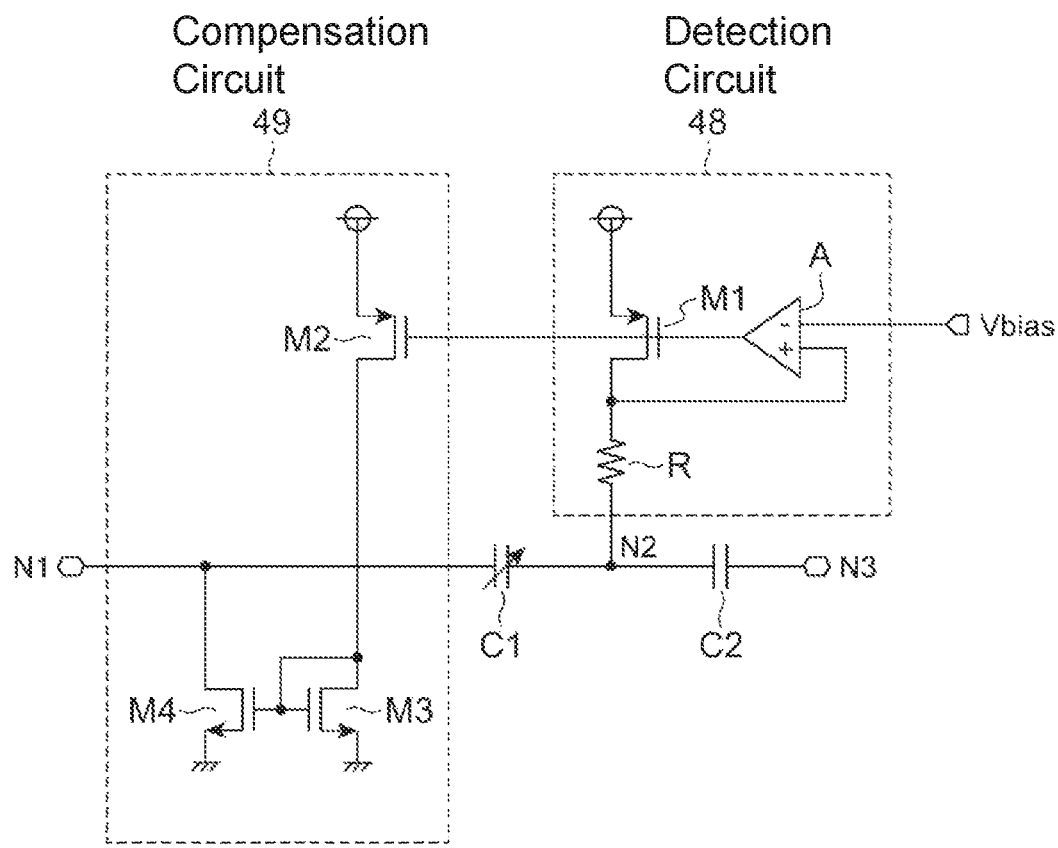
FIG. 7 is a diagram illustrating a first circuit example of a detection circuit 48 and a compensation circuit 49.

FIG. 7 is a diagram illustrating a first circuit example of the detection circuit 48 and the compensation circuit 49. In the first circuit example, the detection circuit 48 includes a PMOS transistor M1, a resistor R, and a differential amplifier A. The compensation circuit 49 includes a PMOS transistor M2, an NMOS transistor M3, and an NMOS transistor M4.

In the detection circuit 48, a source of the PMOS transistor M1 is connected to a power supply potential supply terminal. The resistor R is provided between a drain of the PMOS transistor M1 and a node N2. A non-inverting input terminal of the differential amplifier A is connected to the drain of the PMOS transistor M1. A bias voltage value Vbias is input to an inverting input terminal of the differential amplifier A. An output terminal of the differential amplifier A is connected to a gate of the PMOS transistor M1.

In the compensation circuit 49, a source of the PMOS transistor M2 is connected to the power supply potential supply terminal. A gate of the PMOS transistor M2 is connected to the output terminal of the differential amplifier A. A source of the NMOS transistor M3 is connected to a ground potential supply terminal. A drain of the NMOS transistor M3 is connected to the drain of the PMOS transistor M2. A source of the NMOS transistor M4 is connected to the ground potential supply terminal. A drain of the NMOS transistor M4 is connected to a node N1. A gate of the NMOS transistor M4 is connected to a gate and drain of the NMOS transistor M3. The NMOS transistor M4 constitutes a current mirror circuit together with the NMOS transistor M3, and a current of the same amount as a current flowing through the NMOS transistor M3 flows through the NMOS transistor M4.

In the detection circuit 48, since the inverting input terminal and the non-inverting input terminal of the differential amplifier A have an imaginary short relationship, the inverting input terminal of the differential amplifier A has the same bias voltage value Vbias as the non-inverting input terminal, and the bias voltage value Vbias is applied to the node N2 via the resistor R. A leak current of the variable capacitive element C1 flows from the power supply potential supply terminal to the node N1 through the PMOS transistor M1, the resistor R, and the variable capacitive element C1. That is, the amount of the current flowing through the PMOS transistor M1 is the same as the amount of leak current of the variable capacitive element C1. A voltage value applied from the output terminal of the differential amplifier A to the gate of the PMOS transistor M1 is such that a current of the same amount as the amount of leak current of the variable capacitive element C1 flows through the PMOS transistor M1.

In the compensation circuit 49, the voltage value applied from the output terminal of the differential amplifier A to the gate of the PMOS transistor M2 is the same as the voltage value applied from the output terminal of the differential amplifier A to the gate of the PMOS transistor M1. Therefore, the amount of current flowing through the PMOS transistor M2 is the same as the amount of current flowing through the PMOS transistor M1. The current flowing through the PMOS transistor M2 also flows through the NMOS transistor M3. Since the NMOS transistor M4 and the NMOS transistor M3 constitute a current mirror circuit, the amount of current flowing through the NMOS transistor M4 is the same as the amount of current flowing through the PMOS transistor M3. That is, the amount of current flowing through the NMOS transistor M4 is the same as the amount of leak current of the variable capacitive element C1. Therefore, the current flowing through the NMOS transistor M4 can compensate for the leak current of the variable capacitive element C1.

Figure 8:
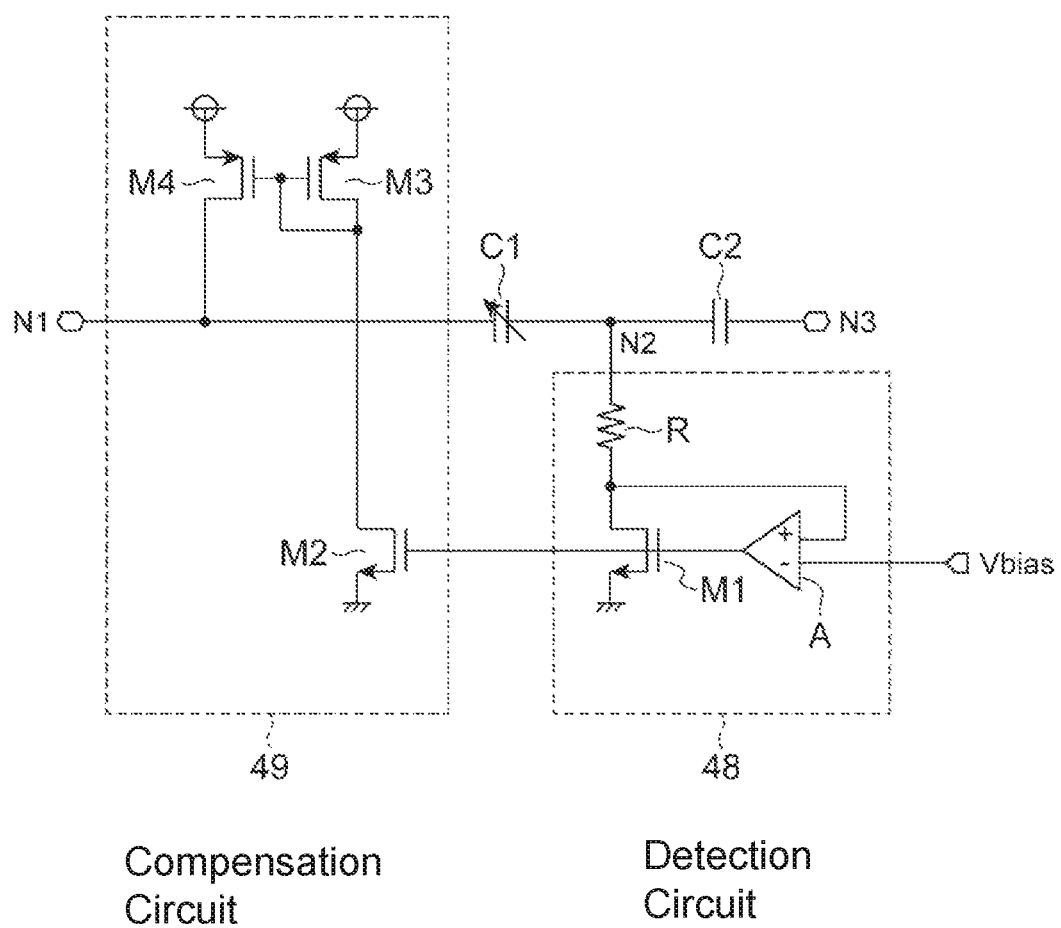
FIG. 8 is a diagram illustrating a second circuit example of the detection circuit 48 and the compensation circuit 49.

FIG. 8 is a diagram illustrating a second circuit example of the detection circuit 48 and the compensation circuit 49. In the second circuit example, the detection circuit 48 includes a NMOS transistor M1, a resistor R, and a differential amplifier A. Further, the compensation circuit 49 includes a NMOS transistor M2, a PMOS transistor M3, and a PMOS transistor M4.

In the detection circuit 48, a source of the NMOS transistor M1 is connected to a ground potential supply terminal. The resistor R is provided between a drain of the NMOS transistor M1 and a node N2. A non-inverting input terminal of the differential amplifier A is connected to the drain of the NMOS transistor M1. A bias voltage value Vbias is input to an inverting input terminal of the differential amplifier A. An output terminal of the differential amplifier A is connected to a gate of the NMOS transistor M1.

In the compensation circuit 49, a source of the NMOS transistor M2 is connected to the ground potential supply terminal. A gate of the NMOS transistor M2 is connected to the output terminal of the differential amplifier A. A source of the PMOS transistor M3 is connected to a power supply potential supply terminal. A drain of the PMOS transistor M3 is connected to a drain of the NMOS transistor M2. A source of the PMOS transistor M4 is connected to the power supply potential supply terminal. A drain of the PMOS transistor M4 is connected to a node N1. A gate of the PMOS transistor M4 is connected to a gate and drain of the PMOS transistor M3. The PMOS transistor M4 constitutes a current mirror circuit together with the PMOS transistor M3, and a current of the same amount as a current flowing through the PMOS transistor M3 flows through the PMOS transistor M4.

In the detection circuit 48, since the inverting input terminal and the non-inverting input terminal of the differential amplifier A have an imaginary short relationship, the inverting input terminal of the differential amplifier A has the same bias voltage value Vbias as the non-inverting input terminal, and the bias voltage value Vbias is applied to the node N2 via the resistor R. A leak current of the variable capacitive element C1 flows from the node N1 to the ground potential supply terminal through the variable capacitive element C1, the resistor R, and the NMOS transistor M1. That is, the amount of the current flowing through the NMOS transistor M1 is the same as the amount of leak current of the variable capacitive element C1. A voltage value applied from the output terminal of the differential amplifier A to the gate of the NMOS transistor M1 is such that a current of the same amount as the amount of leak current of the variable capacitive element C1 flows through the NMOS transistor M1.

In the compensation circuit 49, the voltage value applied from the output terminal of the differential amplifier A to the gate of the NMOS transistor M2 is the same as the voltage value applied from the output terminal of the differential amplifier A to the gate of the NMOS transistor M1. Therefore, the amount of current flowing through the NMOS transistor M2 is the same as the amount of current flowing through the NMOS transistor M1. The current flowing through the NMOS transistor M2 also flows through the PMOS transistor M3. Since the PMOS transistor M4 and the PMOS transistor M3 constitute a current mirror circuit, the amount of current flowing through the PMOS transistor M4 is the same as the amount of current flowing through the NMOS transistor M3. That is, the amount of current flowing through the PMOS transistor M4 is the same as the amount of leak current of the variable capacitive element C1. Therefore, the current flowing through the PMOS transistor M4 can compensate for the leak current of the variable capacitive element C1.

Figure 9:
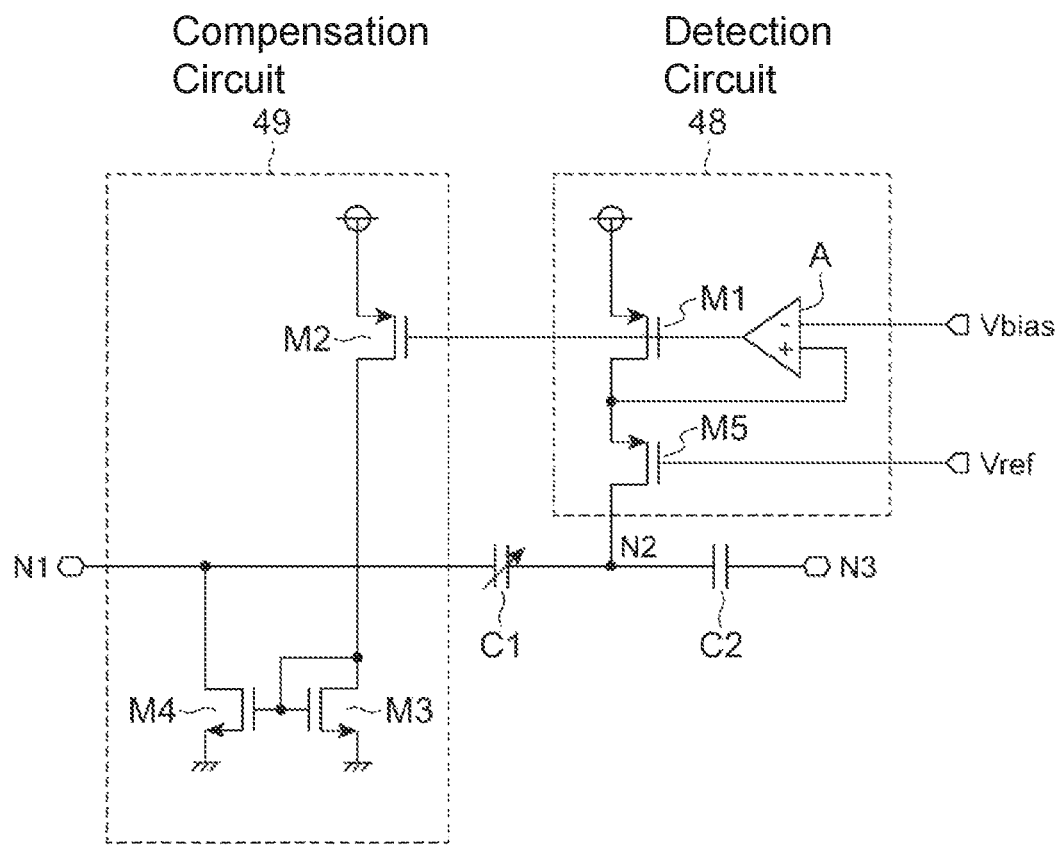
FIG. 9 is a diagram illustrating a third circuit example of the detection circuit 48 and the compensation circuit 49.

FIG. 9 is a diagram illustrating a third circuit example of the detection circuit 48 and the compensation circuit 49. In the third circuit example, the detection circuit 48 includes a PMOS transistor M1, a PMOS transistor M5, and a differential amplifier A. Further, the compensation circuit 49 includes a PMOS transistor M2, an NMOS transistor M3, and an NMOS transistor M4.

The third circuit example (FIG. 9) is different from the first circuit example (FIG. 7) in that the detection circuit 48 includes the PMOS transistor M5 instead of the resistor R. The PMOS transistor M5 is provided between a drain of the PMOS transistor M1 and a node N2. Since the PMOS transistor M5 may be used as a resistive unit like the resistor R, the PMOS transistor M5 has a resistance value according to a reference voltage value Vref applied to a gate. By using the PMOS transistor M5 as a resistive unit, a high-resistance resistive unit can be realized with a small layout area.

Figure 10:
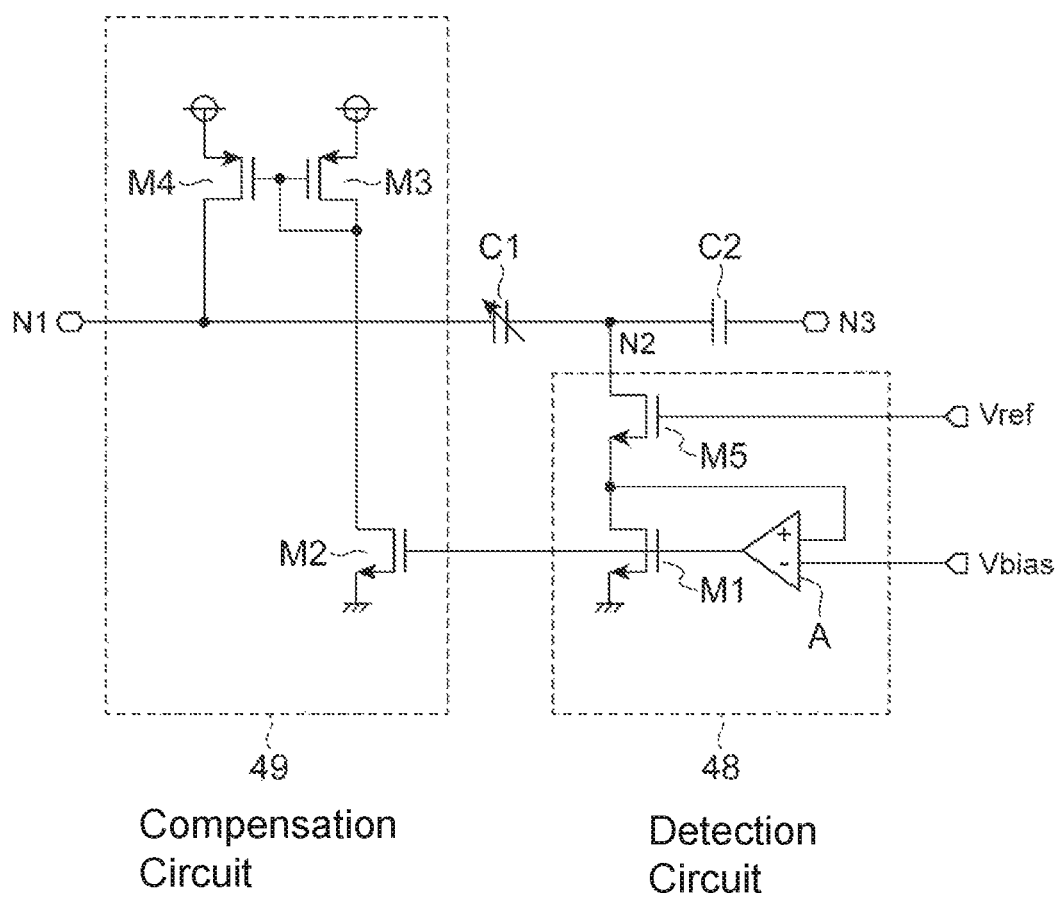
FIG. 10 is a diagram illustrating a fourth circuit example of the detection circuit 48 and the compensation circuit 49.

FIG. 10 is a diagram illustrating a fourth circuit example of the detection circuit 48 and the compensation circuit 49. In the fourth circuit example, the detection circuit 48 includes an NMOS transistor M1, an NMOS transistor M5, and a differential amplifier A. Further, the compensation circuit 49 includes an NMOS transistor M2, a PMOS transistor M3, and a PMOS transistor M4.

The fourth circuit example (FIG. 10) is different from the second circuit example (FIG. 8) in that the detection circuit 48 includes the NMOS transistor M5 instead of the resistor R. The NMOS transistor M5 is provided between a drain of the NMOS transistor M1 and a node N2. Since the NMOS transistor M5 may be used as a resistive unit like the resistor R, the NMOS transistor M5 has a resistance value according to a reference voltage value Vref applied to a gate. By using the NMOS transistor M5 as a resistive unit, a high-resistance resistive unit can be realized with a small layout area.

In the first circuit example (FIG. 7), the second circuit example (FIG. 8), the third circuit example (FIG. 9) and the fourth circuit example (FIG. 10) described above, the leak current becomes small according to a magnitude of the control voltage value VC, the amount of leak current cannot be detected by the detection circuit 48, and the compensation circuit 49 is likely to be unable to compensate for the leak current. As a countermeasure, it is preferable for a first current source I1 or a second current source I2 causing a dummy leak current to flow to be provided, as in a fifth circuit example (FIG. 11), a sixth circuit example (FIG. 12), a seventh circuit example (FIG. 13), and an eighth circuit example (FIG. 14) to be described below. It is appropriate for the amount of the dummy leak current caused to flow by the first current source I1 or the second current source I2 to be about tens of nA. Such a dummy leak current caused to flow becomes a leak current generated by the circuit. However, since the amount of the dummy leak current is sufficiently smaller than the amount of current from the charge pump by about 1/100, the amount of the dummy leak current can be treated as an error.

Figure 11:
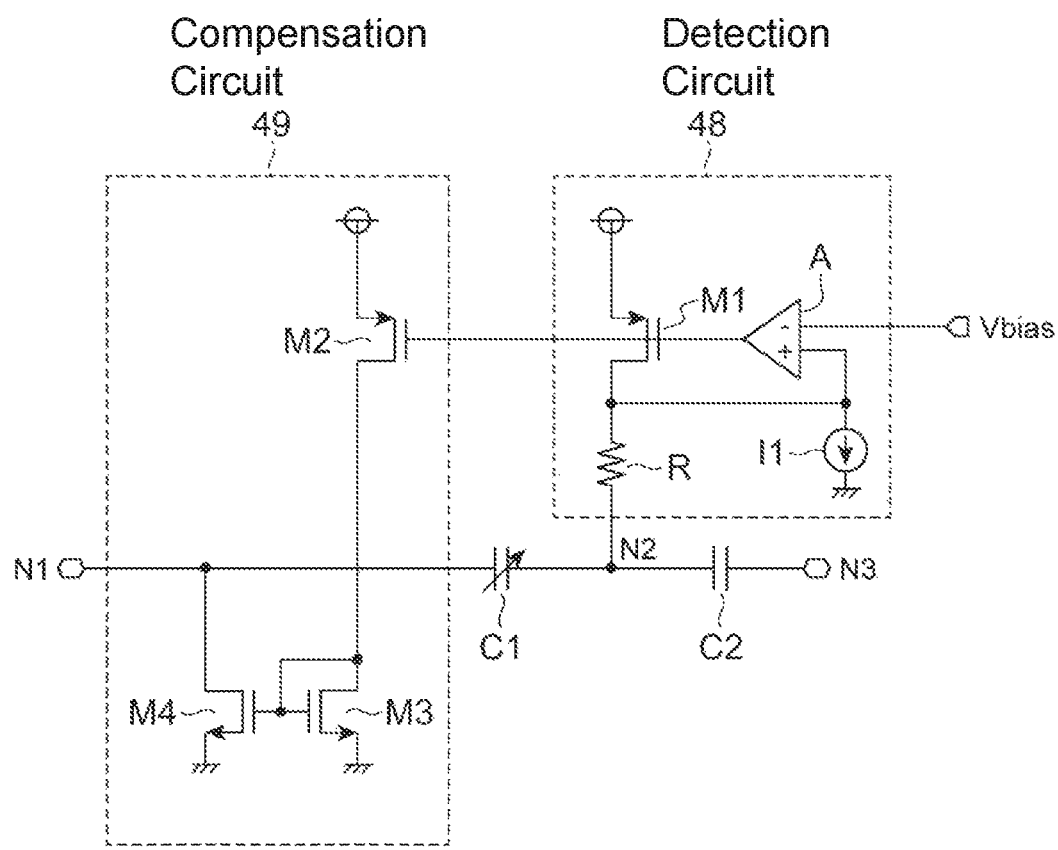
FIG. 11 is a diagram illustrating a fifth circuit example of the detection circuit 48 and the compensation circuit 49.

FIG. 11 is a diagram illustrating the fifth circuit example of the detection circuit 48 and the compensation circuit 49. In the fifth circuit example, the detection circuit 48 includes a PMOS transistor M1, a resistor R, a differential amplifier A, and a first current source I1. Further, the compensation circuit 49 includes a PMOS transistor M2, an NMOS transistor M3, and an NMOS transistor M4. The fifth circuit example (FIG. 11) is different from the first circuit example (FIG. 7) in that the detection circuit 48 further includes the first current source I1. The first current source I1 is provided between a ground potential supply terminal and a drain of the PMOS transistor M1.

Figure 12:
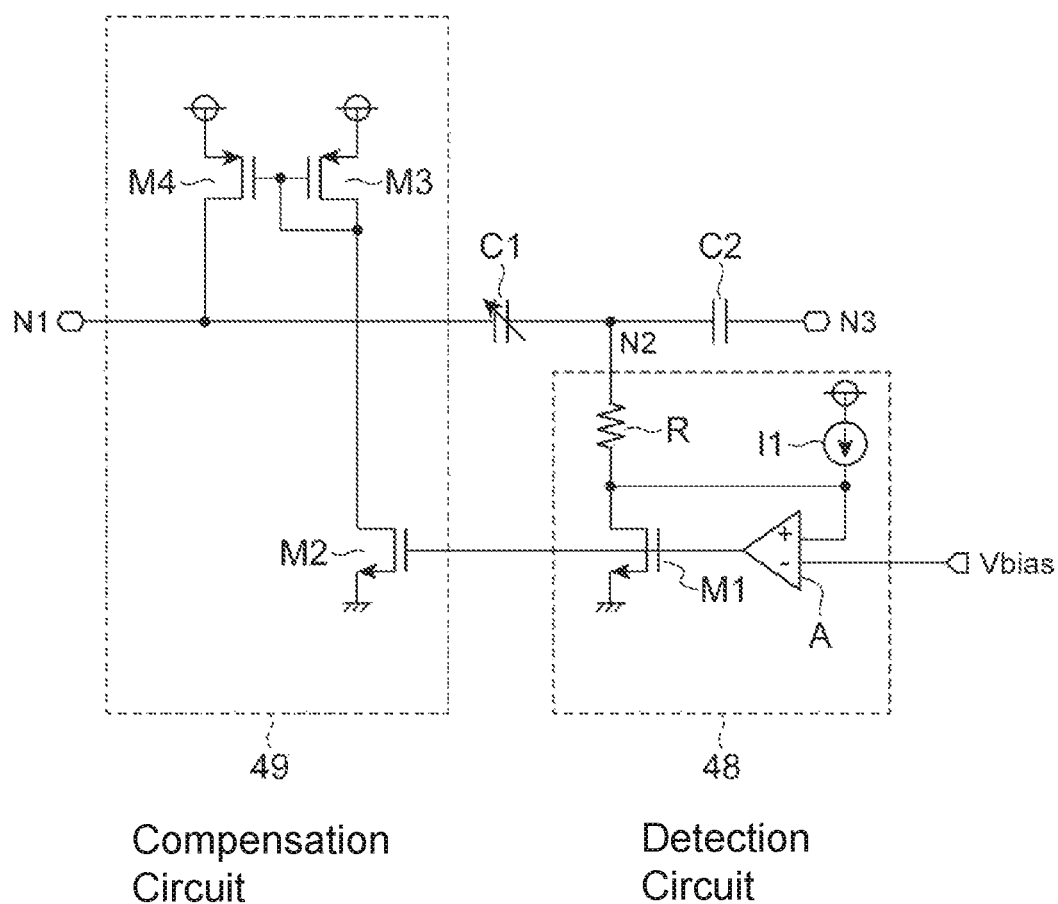
FIG. 12 is a diagram illustrating a sixth circuit example of the detection circuit 48 and the compensation circuit 49.

FIG. 12 is a diagram illustrating the sixth circuit example of the detection circuit 48 and the compensation circuit 49. In the sixth circuit example, the detection circuit 48 includes an NMOS transistor M1, a resistor R, a differential amplifier A, and a first current source I1. Further, the compensation circuit 49 includes an NMOS transistor M2, a PMOS transistor M3, and a PMOS transistor M4. The sixth circuit example (FIG. 12) is different from the second circuit example (FIG. 8) in that the detection circuit 48 further includes the first current source I1. The first current source I1 is provided between a power supply potential supply terminal and a drain of the NMOS transistor M1.

Figure 13:
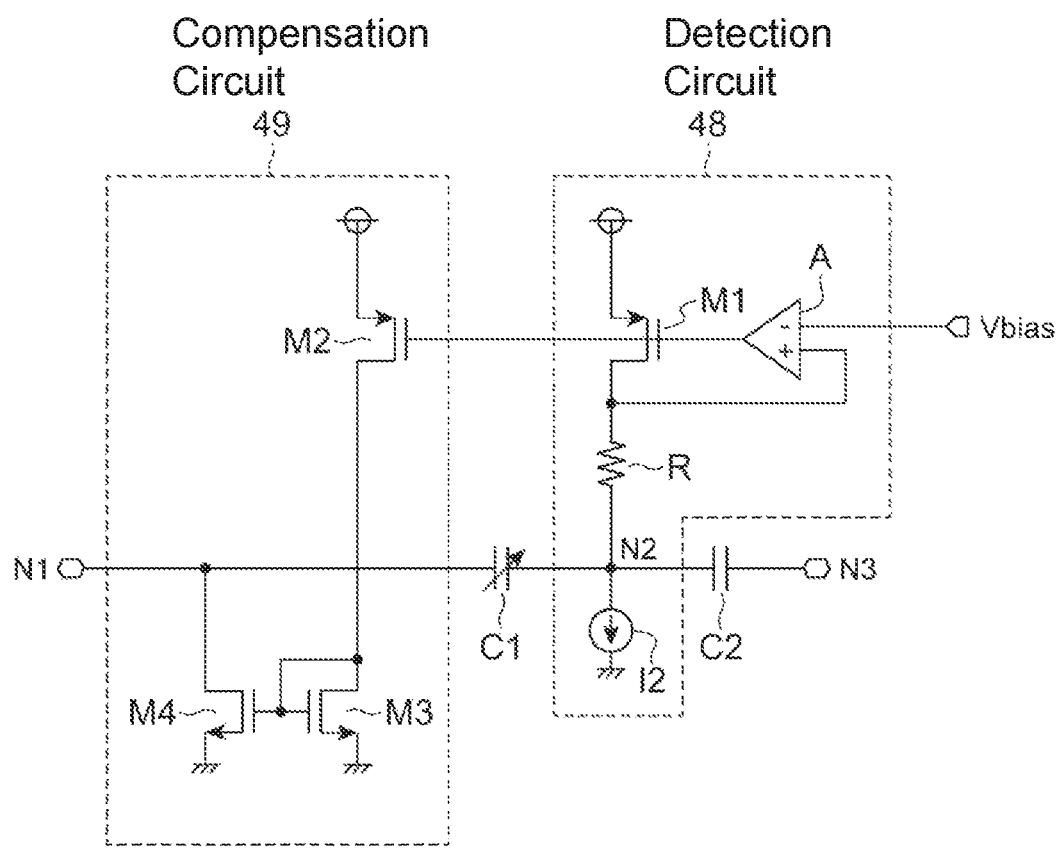
FIG. 13 is a diagram illustrating a seventh circuit example of the detection circuit 48 and the compensation circuit 49.

FIG. 13 is a diagram illustrating the seventh circuit example of the detection circuit 48 and the compensation circuit 49. In the seventh circuit example, the detection circuit 48 includes a PMOS transistor M1, a resistor R, a differential amplifier A, and a second current source I2. Further, the compensation circuit 49 includes a PMOS transistor M2, an NMOS transistor M3, and an NMOS transistor M4. The seventh circuit example (FIG. 11) is different from the first circuit example (FIG. 7) in that the detection circuit 48 further includes the second current source I2. The second current source I2 is provided between a ground potential supply terminal and a node N2.

Figure 14:
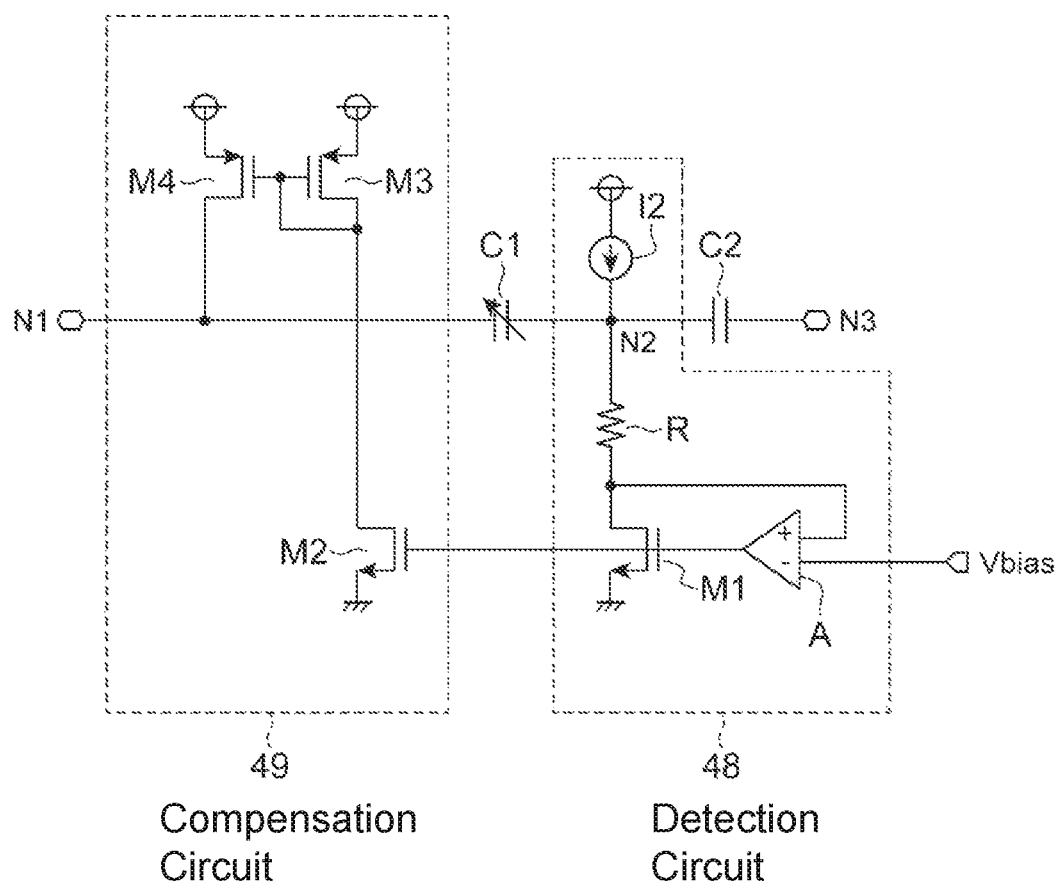
FIG. 14 is a diagram illustrating an eighth circuit example of the detection circuit 48 and the compensation circuit 49.

FIG. 14 illustrates the eighth circuit example of the detection circuit 48 and the compensation circuit 49. In the eighth circuit example, the detection circuit 48 includes an NMOS transistor M1, a resistor R, a differential amplifier A, and a second current source I2. Further, the compensation circuit 49 includes an NMOS transistor M2, a PMOS transistor M3, and a PMOS transistor M4. The eighth circuit example (FIG. 12) is different from the second circuit example (FIG. 8) in that the detection circuit 48 further includes the second current source I2. The second current source I2 is provided between a power supply potential supply terminal and a node N2.

In each of the fifth circuit example (FIG. 11), the sixth circuit example (FIG. 12), the seventh circuit example (FIG. 13), and the eighth circuit example (FIG. 14), the resistor R may be replaced with a MOS transistor M5, as in the third circuit example (FIG. 9) and the fourth circuit example (FIG. 10).

In the fifth circuit example (FIG. 11), the sixth circuit example (FIG. 12), the seventh circuit example (FIG. 13), and the eighth circuit example (FIG. 14) described above, an error is caused by the dummy leak current flowing due to the first current source I1 or the second current source I2. In the ninth circuit example (FIG. 15), the tenth circuit example (FIG. 16), the eleventh circuit example (FIG. 17), and the twelfth circuit example (FIG. 18) to be described below, a third current source I3 or a fourth current source I4 for suppressing this error is provided.

Figure 15:
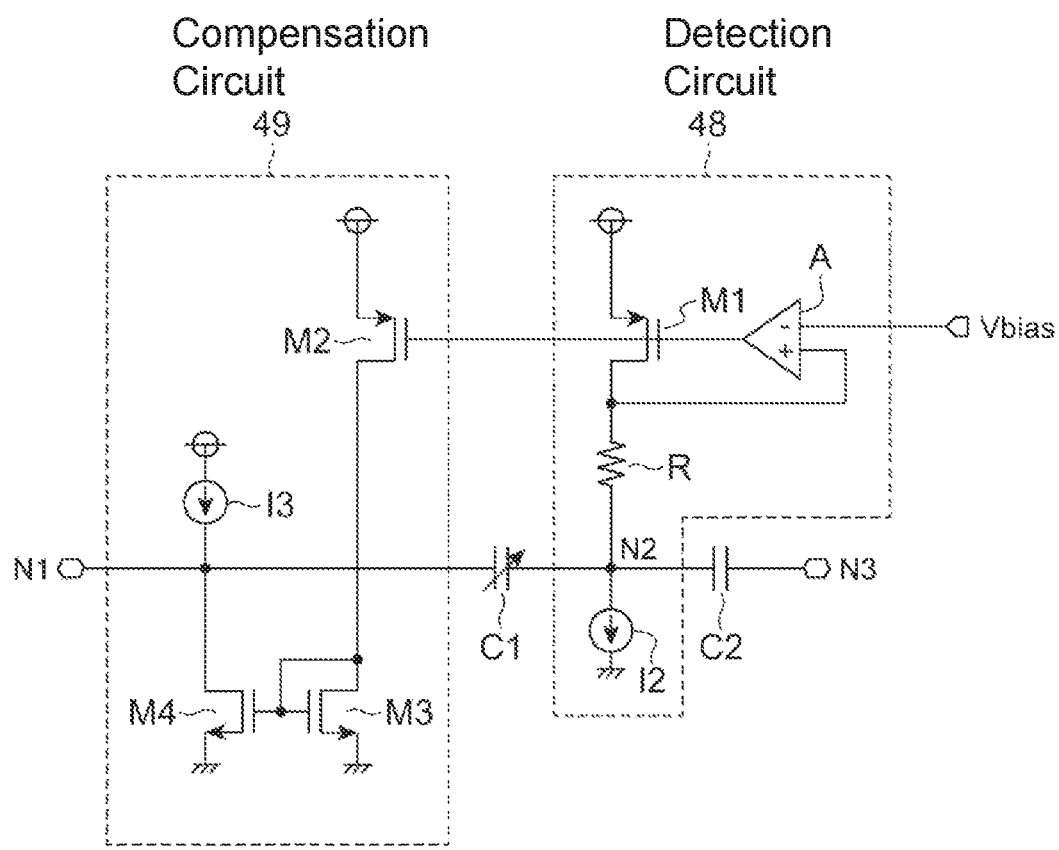
FIG. 15 is a diagram illustrating a ninth circuit example of the detection circuit 48 and the compensation circuit 49.

FIG. 15 is a diagram illustrating the ninth circuit example of the detection circuit 48 and the compensation circuit 49. In the ninth circuit example, the detection circuit 48 includes a PMOS transistor M1, a resistor R, a differential amplifier A, and a second current source I2.

Further, the compensation circuit 49 includes a PMOS transistor M2, an NMOS transistor M3, an NMOS transistor M4, and a third current source I3. The ninth circuit example (FIG. 15) is different from the seventh circuit example (FIG. 13) in that the compensation circuit 49 further includes the third current source I3. The third current source I3 is provided between a power supply potential supply terminal and a node N1. The amount of current caused to flow by the third current source I3 is the same as the amount of current caused to flow by the second current source I2.

Figure 16:
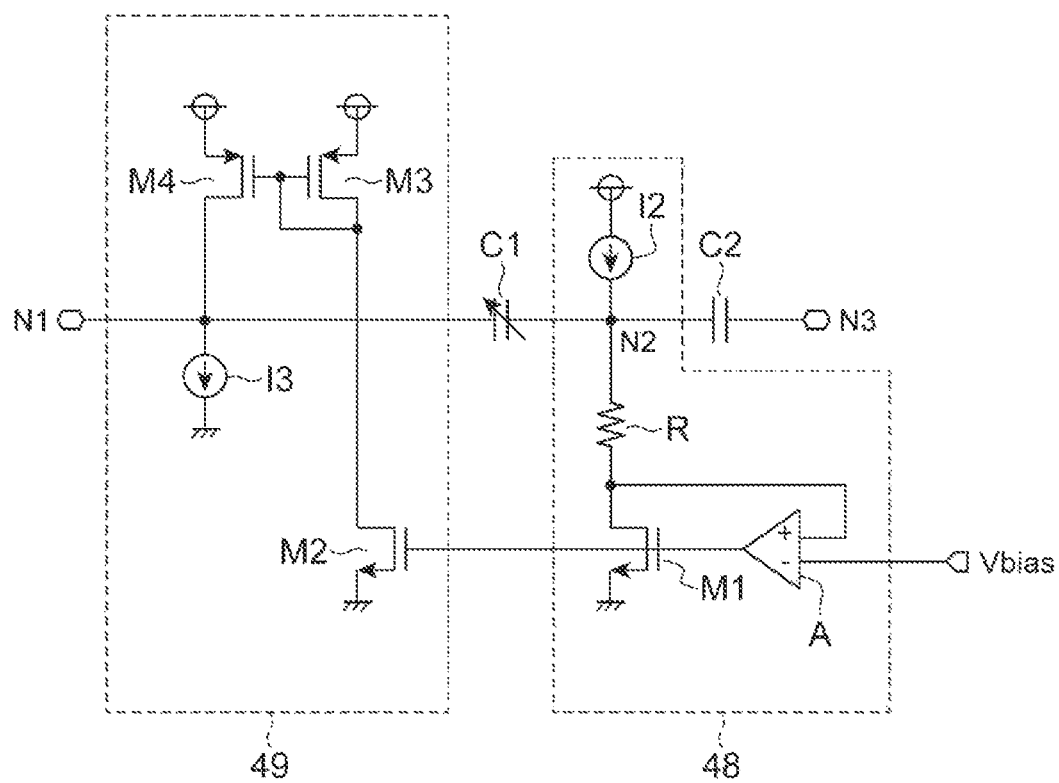
FIG. 16 is a diagram illustrating a tenth circuit example of the detection circuit 48 and the compensation circuit 49.

FIG. 16 is a diagram illustrating the tenth circuit example of the detection circuit 48 and the compensation circuit 49. In the tenth circuit example, the detection circuit 48 includes an NMOS transistor M1, a resistor R, a differential amplifier A, and a second current source I2. Further, the compensation circuit 49 includes an NMOS transistor M2, a PMOS transistor M3, a PMOS transistor M4, and a third current source I3. The tenth circuit example (FIG. 16) is different from the eighth circuit example (FIG. 14) in that the compensation circuit 49 further includes the third current source I3. The third current source I3 is provided between a ground potential supply terminal and a node N1. The amount of current caused to flow by the third current source I3 is the same as the amount of current caused to flow by the second current source I2.

Figure 17:
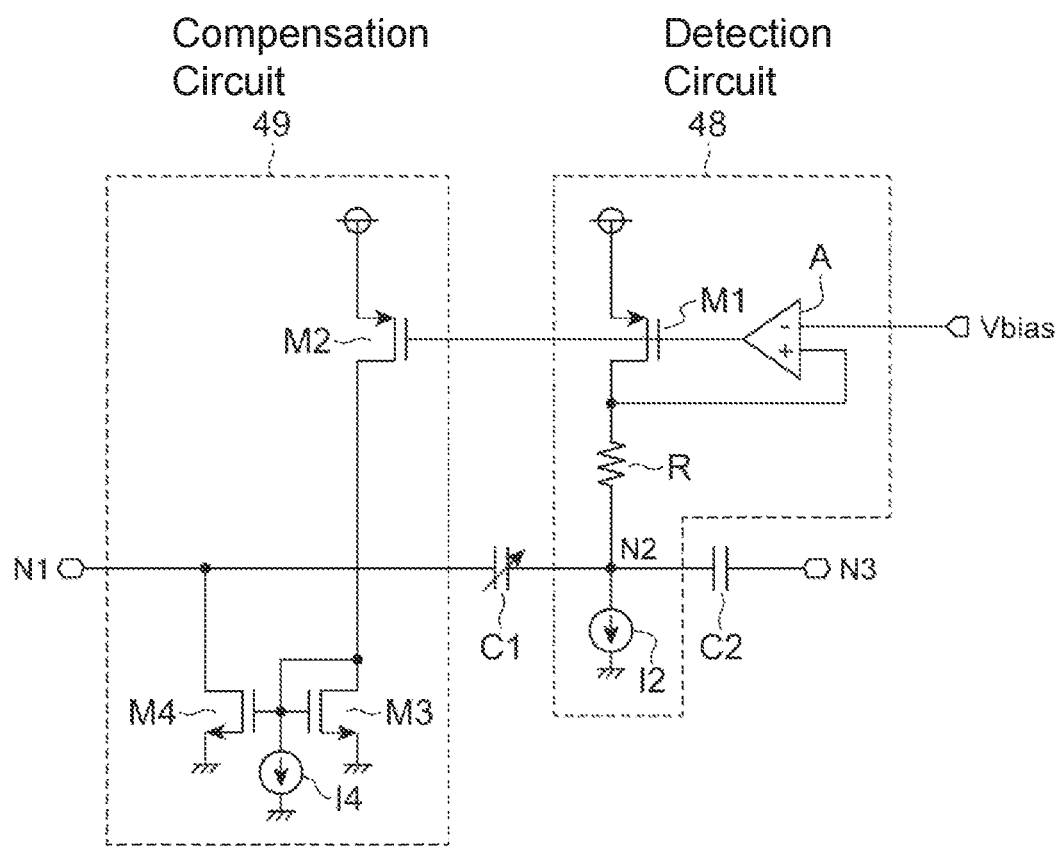
FIG. 17 is a diagram illustrating an eleventh circuit example of the detection circuit 48 and the compensation circuit 49.

FIG. 17 is a diagram illustrating the eleventh circuit example of the detection circuit 48 and the compensation circuit 49. In the eleventh circuit example, the detection circuit 48 includes a PMOS transistor M1, a resistor R, a differential amplifier A, and a second current source I2. Further, the compensation circuit 49 includes a PMOS transistor M2, an NMOS transistor M3, an NMOS transistor M4, and a fourth current source I4. The eleventh circuit example (FIG. 17) is different from the seventh circuit example (FIG. 13) in that the compensation circuit 49 further includes the fourth current source I4. The fourth current source I4 is provided between a ground potential supply terminal and gates of the NMOS transistor M3 and the NMOS transistor M4. The amount of current caused to flow by the fourth current source I4 is the same as the amount of current caused to flow by the second current source I2.

Figure 18:
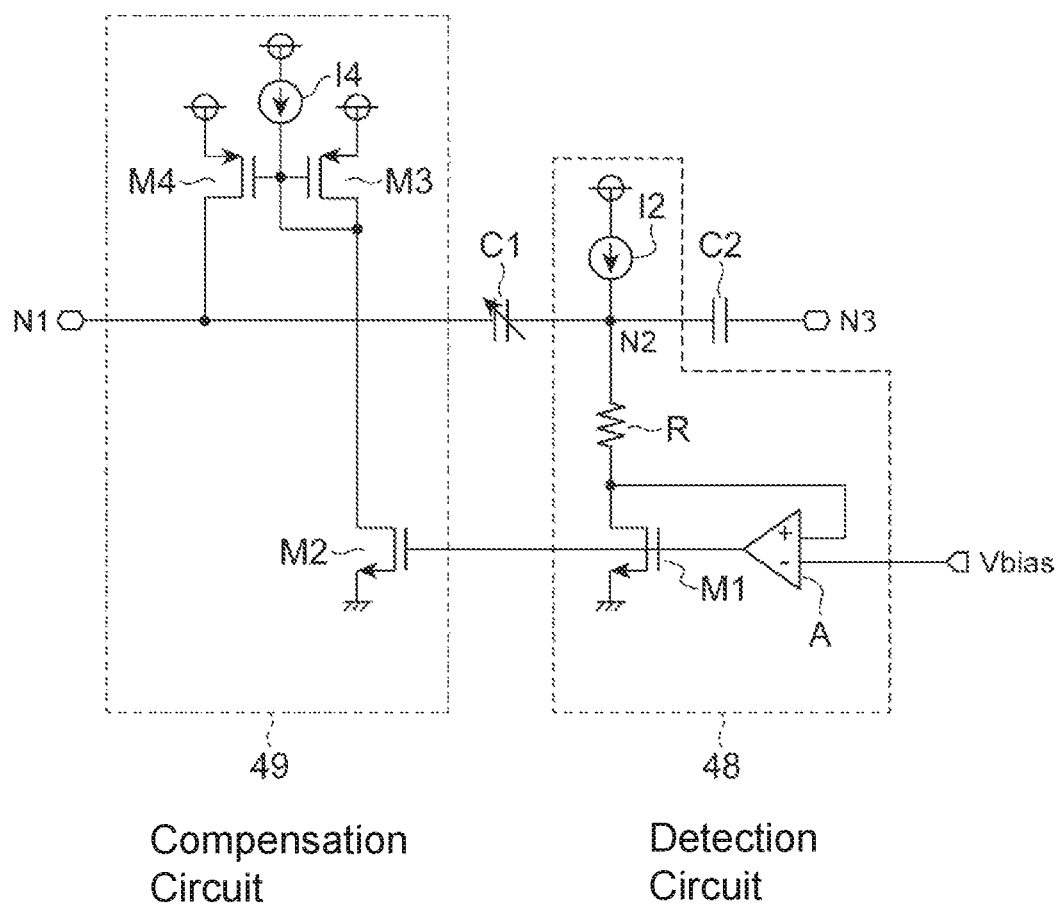
FIG. 18 is a diagram illustrating a twelfth circuit example of the detection circuit 48 and the compensation circuit 49.

FIG. 18 is a diagram illustrating the twelfth circuit example of the detection circuit 48 and the compensation circuit 49. In the twelfth circuit example, the detection circuit 48 includes an NMOS transistor M1, a resistor R, a differential amplifier A, and a second current source I2. Further, the compensation circuit 49 includes an NMOS transistor M2, a PMOS transistor M3, a PMOS transistor M4, and a fourth current source I4. The twelfth circuit example (FIG. 18) is different from the eighth circuit example (FIG. 14) in that the compensation circuit 49 further includes the fourth current source I4. The fourth current source I4 is provided between a power supply potential supply terminal and gates of the PMOS transistor M3 and the PMOS transistor M4. The amount of current caused to flow by the fourth current source I4 is the same as the amount of current caused to flow by the second current source I2.

In each of the ninth circuit example (FIG. 15), the tenth circuit example (FIG. 16), the eleventh circuit example (FIG. 17), and the twelfth circuit example (FIG. 18), the resistor R may be replaced with the MOS transistor M5, as in the third circuit example (FIG. 9) and the fourth circuit example (FIG. 10). Further, the third current source I3 or the fourth current source I4 may be provided in each of the fifth circuit example (FIG. 11) and the sixth circuit example (FIG. 12).

In each of the fifth to twelfth circuit examples described above, the dummy leak current flows due to the first current source I1 or the second current source I2. Further, in each of the ninth to twelfth circuit examples, an error caused by the dummy leak current flowing due to the first current source I1 or the second current source I2 is suppressed by the third current source I3 or the fourth current source I4. A thirteenth circuit example (FIG. 19), a fourteenth circuit example (FIG. 20), and a fifteenth circuit example (FIG. 21) to be described below constitute the detection circuit 48 and the compensation circuit 49 without addition of a current source.

Figure 19:
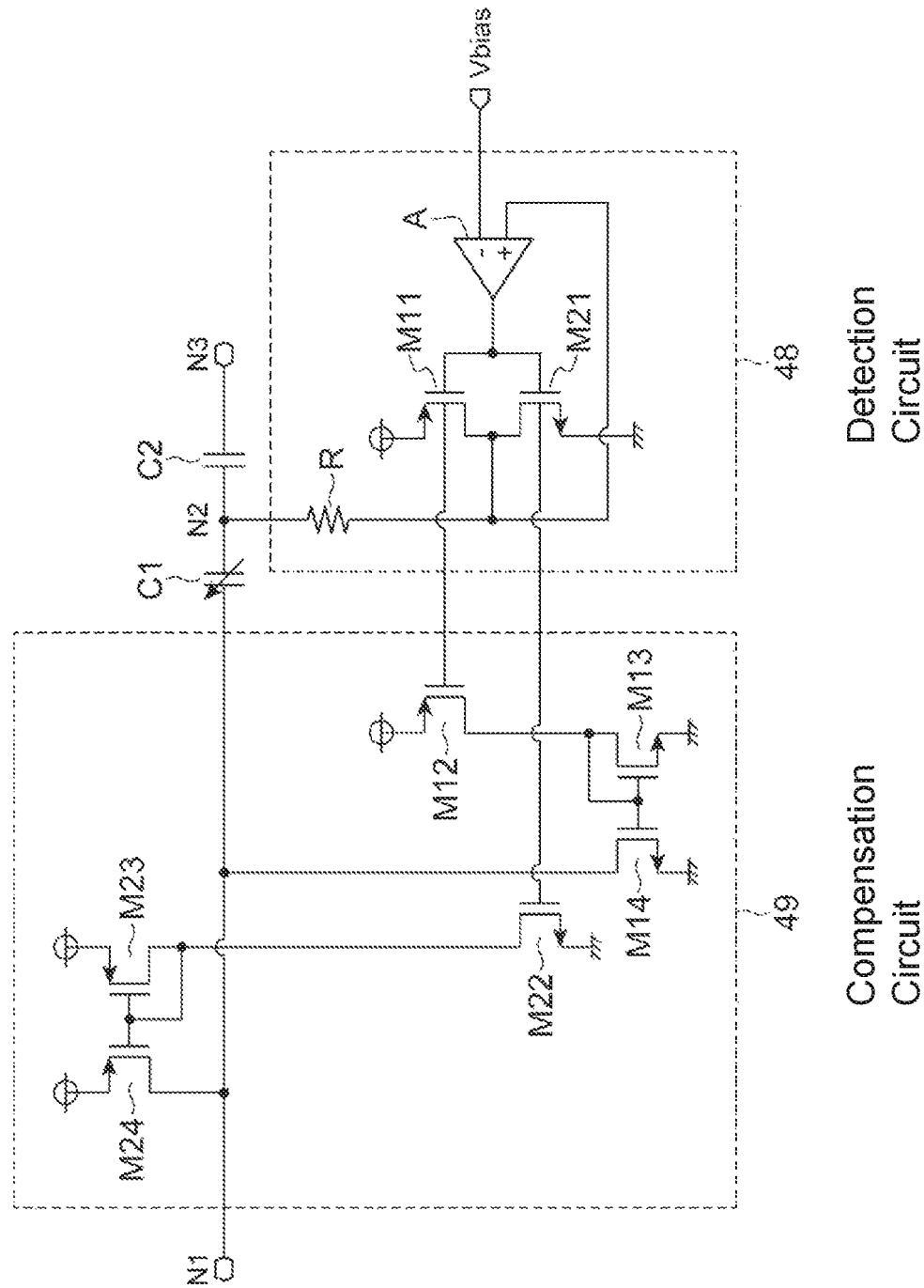
FIG. 19 is a diagram illustrating a thirteenth circuit example of the detection circuit 48 and the compensation circuit 49.

FIG. 19 is a diagram illustrating the thirteenth circuit example of the detection circuit 48 and the compensation circuit 49. In the thirteenth circuit example, the detection circuit 48 includes a PMOS transistor M11, an NMOS transistor M21, a resistor R, and a differential amplifier A. The compensation circuit 49 includes a PMOS transistor M12, an NMOS transistor M13, an NMOS transistor M14, an NMOS transistor M22, a PMOS transistor M23, and a PMOS transistor M24.

In the detection circuit 48, a source of the PMOS transistor M11 is connected to a power supply potential supply terminal. A source of the NMOS transistor M21 is connected to a ground potential supply terminal. Drains of the PMOS transistor M11 and the NMOS transistor M21 are connected to each other. The resistor R is provided between the drain of each of the PMOS transistor M11 and the NMOS transistor M21 and a node N2. A non-inverting input terminal of the differential amplifier A is connected to the drains of the PMOS transistor M11 and the NMOS transistor M21. A bias voltage value Vbias is input to an inverting input terminal of the differential amplifier A. An output terminal of the differential amplifier A is connected to gates of the PMOS transistor M11 and the NMOS transistor M21.

In the compensation circuit 49, a source of the PMOS transistor M12 is connected to the power supply potential supply terminal. A gate of the PMOS transistor M12 is connected to an output terminal of the differential amplifier A. A source of the NMOS transistor M13 is connected to the ground potential supply terminal. A drain of the NMOS transistor M13 is connected to a drain of the PMOS transistor M12. A source of the NMOS transistor M14 is connected to the ground potential supply terminal. A drain of the NMOS transistor M14 is connected to a node N1. A gate of the NMOS transistor M14 is connected to a gate and the drain of the NMOS transistor M13. The NMOS transistor M14 constitutes a current mirror circuit together with the NMOS transistor M13, and a current of the same amount as the current flowing through the NMOS transistor M13 flows through the NMOS transistor M14.

Further, in the compensation circuit 49, a source of the NMOS transistor M22 is connected to the ground potential supply terminal. A gate of the NMOS transistor M22 is connected to the output terminal of the differential amplifier A. A source of the PMOS transistor M23 is connected to the power supply potential supply terminal. A drain of the PMOS transistor M23 is connected to a drain of the NMOS transistor M22. A source of the PMOS transistor M24 is connected to the power supply potential supply terminal. A drain of the PMOS transistor M24 is connected to the node N1. A gate of the PMOS transistor M24 is connected to a gate and the drain of the PMOS transistor M23. The PMOS transistor M24 constitutes a current mirror circuit together with the PMOS transistor M23, and a current of the same amount as the current flowing through the PMOS transistor M23 flows through the PMOS transistor M24.

The thirteenth circuit example (FIG. 19) of the detection circuit 48 and the compensation circuit 49 has a configuration in which the configurations of both of the first circuit example (FIG. 7) and the second circuit example (FIG. 8) are included, and the resistor R and the differential amplifier A included in the second circuit example (FIG. 7) and the second circuit example (FIG. 8) are common. The PMOS transistor M11 and the NMOS transistor M21 in the detection circuit 48 constitute a push-pull buffer.

Figure 20:
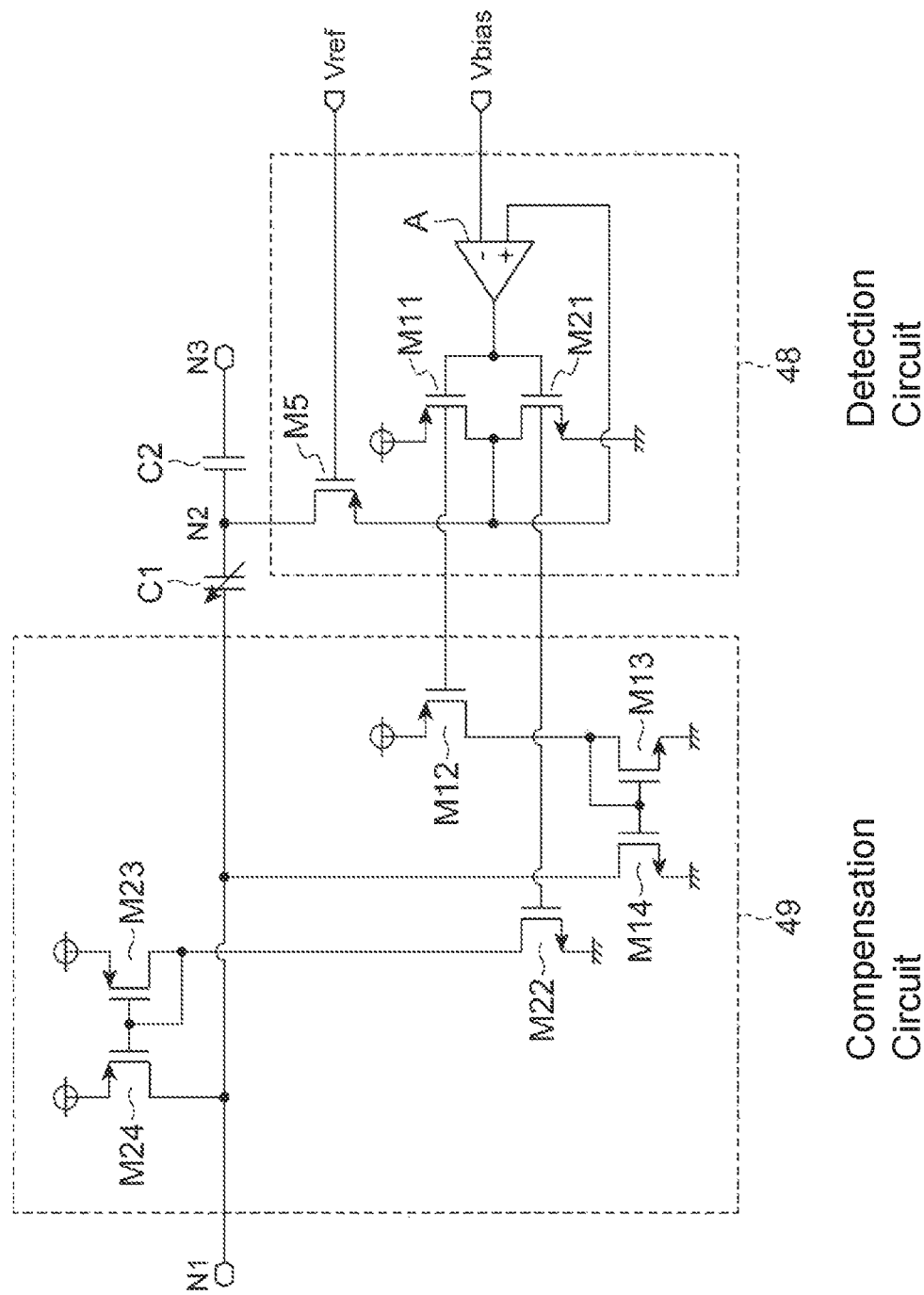
FIG. 20 is a diagram illustrating a fourteenth example of the detection circuit 48 and the compensation circuit 49.
Figure 21:
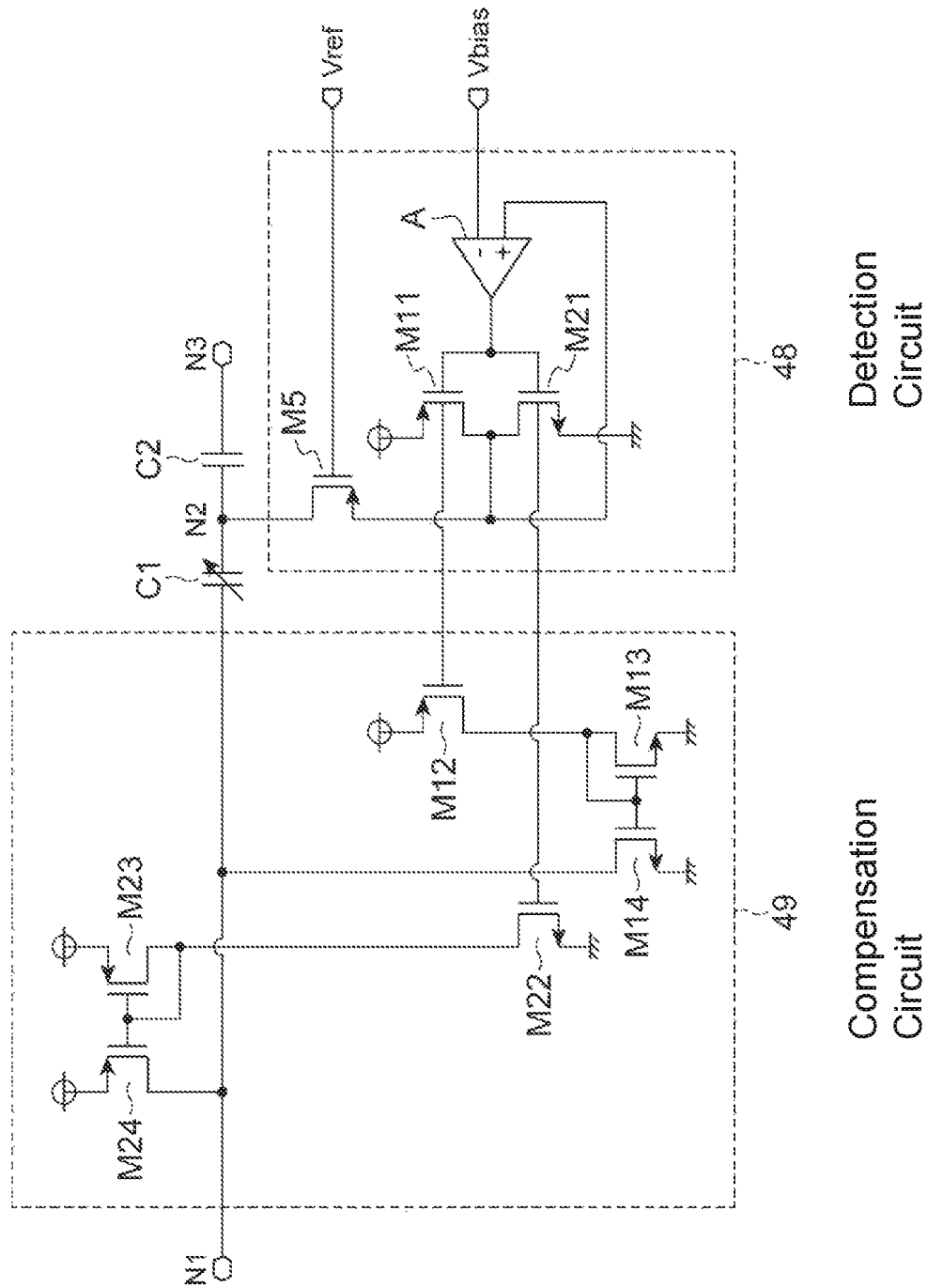
FIG. 21 is a diagram illustrating a fifteenth circuit example of the detection circuit 48 and the compensation circuit 49.

FIG. 20 illustrates a fourteenth circuit example of the detection circuit 48 and the compensation circuit 49. FIG. 21 is a diagram illustrating a fifteenth circuit example of the detection circuit 48 and the compensation circuit 49. In each of the fourteenth circuit example (FIG. 20) and the fifteenth circuit example (FIG. 21), the detection circuit 48 includes a PMOS transistor M11, an NMOS transistor M21, a MOS transistor M5, and a differential amplifier A. The compensation circuit 49 includes a PMOS transistor M12, an NMOS transistor M13, an NMOS transistor M14, an NMOS transistor M22, a PMOS transistor M23, and a PMOS transistor M24.

Each of the fourteenth circuit example (FIG. 20) and the fifteenth circuit example (FIG. 21) is different from the thirteenth circuit example (FIG. 19) in that the detection circuit 48 includes the MOS transistor M5 instead of the resistor R. The MOS transistor M5 is provided between a drain of each of the PMOS transistor M11 and the NMOS transistor M21 and a node N2. Since the MOS transistor M5 may be used as a resistive unit like the resistor R, the MOS transistor M5 has a resistance value according to a reference voltage value Vref applied to a gate. By using the MOS transistor M5 as a resistive unit, a high-resistance resistive unit can be realized with a small layout area.

The fourteenth circuit example (FIG. 20) and the fifteenth circuit example (FIG. 21) are different in a direction of the leak current flowing through the variable capacitive element C1. In the fourteenth circuit example (FIG. 20), the leak current of the variable capacitive element C1 flows from the node N1 to the ground potential supply terminal through the variable capacitive element C1, the MOS transistor M5, and the NMOS transistor M21. In the fifteenth circuit example (FIG. 21), the leak current of the variable capacitive element C1 flows from the power supply potential supply terminal to the node N1 through the PMOS transistor M11, the MOS transistor M5, and the variable capacitive element C1.

Figure 22:
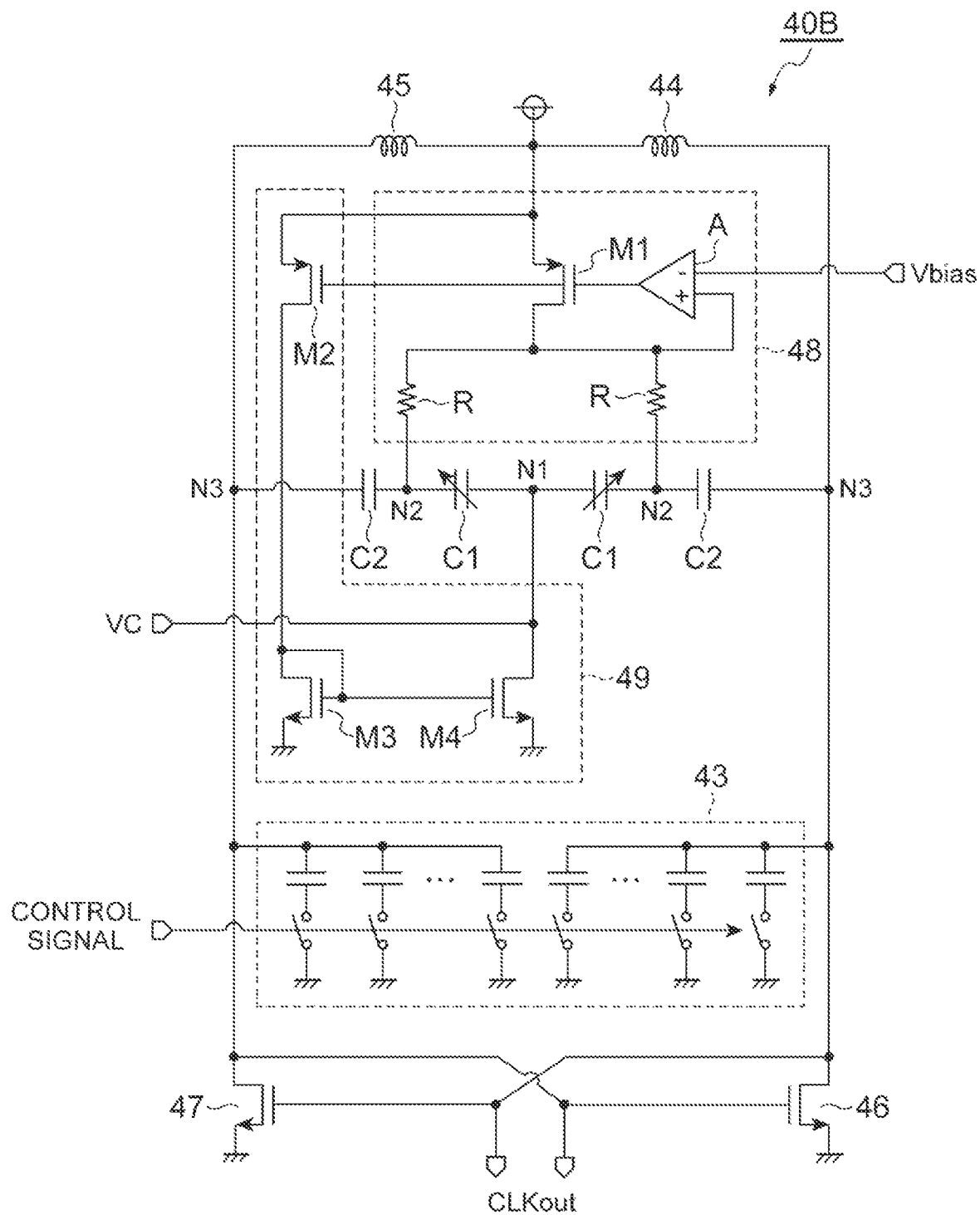
FIG. 22 is a diagram illustrating a configuration of a voltage-controlled oscillator 40B (FIG. 6) in which the first circuit example (FIG. 7) has been adopted.

FIG. 22 is a diagram illustrating a configuration of the voltage-controlled oscillator 40B (FIG. 6) in which the first circuit example (FIG. 7) is adopted. The detection circuit 48 has a low dropout (LDO) configuration, and applies the same voltage value as the bias voltage value Vbias input to the inverting input terminal of the differential amplifier A to the node N2 from the non-inverting input terminal of the differential amplifier A via the resistor R. A current of the same amount as the leak current of the two variable capacitive elements C1 flows through the PMOS transistor M1. The amount of current flowing through the PMOS transistor M2 is the same as the amount of current flowing through the PMOS transistor M1. The current flowing through the PMOS transistor M2 also flows through the NMOS transistor M3. Since the NMOS transistor M4 and the NMOS transistor M3 constitute a current mirror circuit, the amount of current flowing through the NMOS transistor M4 is the same as the amount of current flowing through the PMOS transistor M3. That is, the amount of current flowing through the NMOS transistor M4 is the same as the amount of leak current of the two variable capacitive elements C1. Therefore, the current flowing through the NMOS transistor M4 can compensate for the leak current of the two variable capacitive elements C1.

Figure 23:
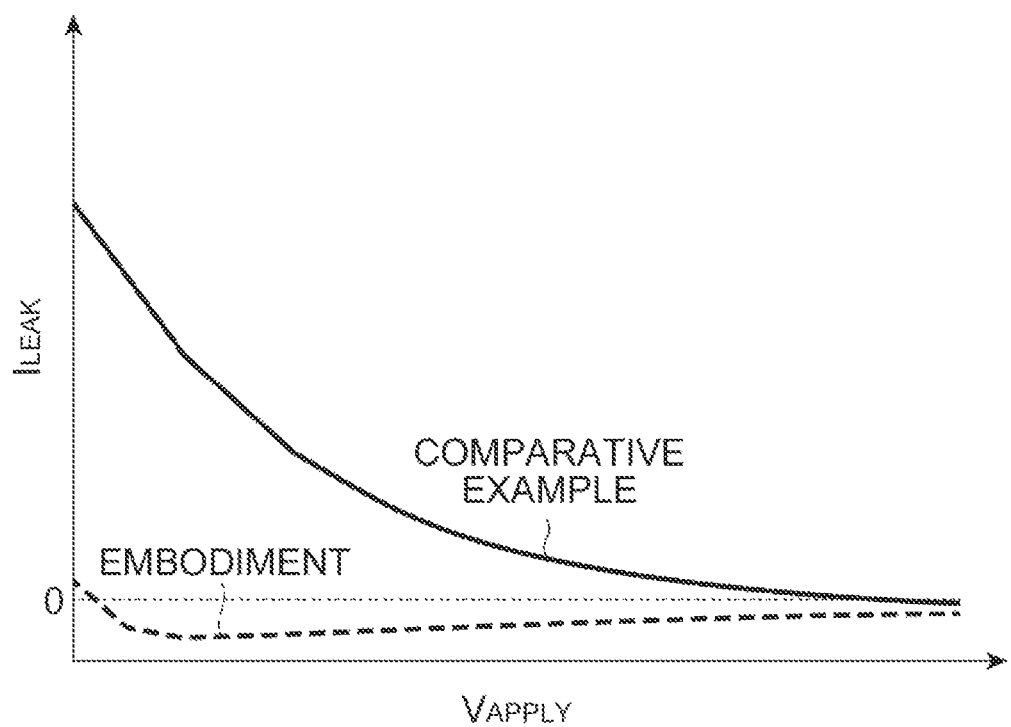
FIG. 23 is a diagram illustrating a relationship between an applied voltage value between two terminals in a variable capacitive element and the amount of leak current.

FIG. 23 is a diagram illustrating a relationship between an applied voltage value $V_{APPLY}$ between two terminals in the variable capacitive element and an amount of leak current $I_{LEAK}$. Here, the leak current indicates a current flowing from the voltage-controlled oscillator to the charge pump (or a current flowing in an opposite direction thereof) in the leak current of the variable capacitive element C1. FIG. 23 illustrates a comparative example in which the detection circuit 48 and the compensation circuit 49 are not provided, and an embodiment in which the detection circuit 48 and the compensation circuit 49 are provided. By providing the detection circuit 48 and the compensation circuit 49, the amount of the current flowing from the voltage-controlled oscillator to the charge pump in the leak current of the variable capacitive element C1 is greatly reduced.

Figure 24:
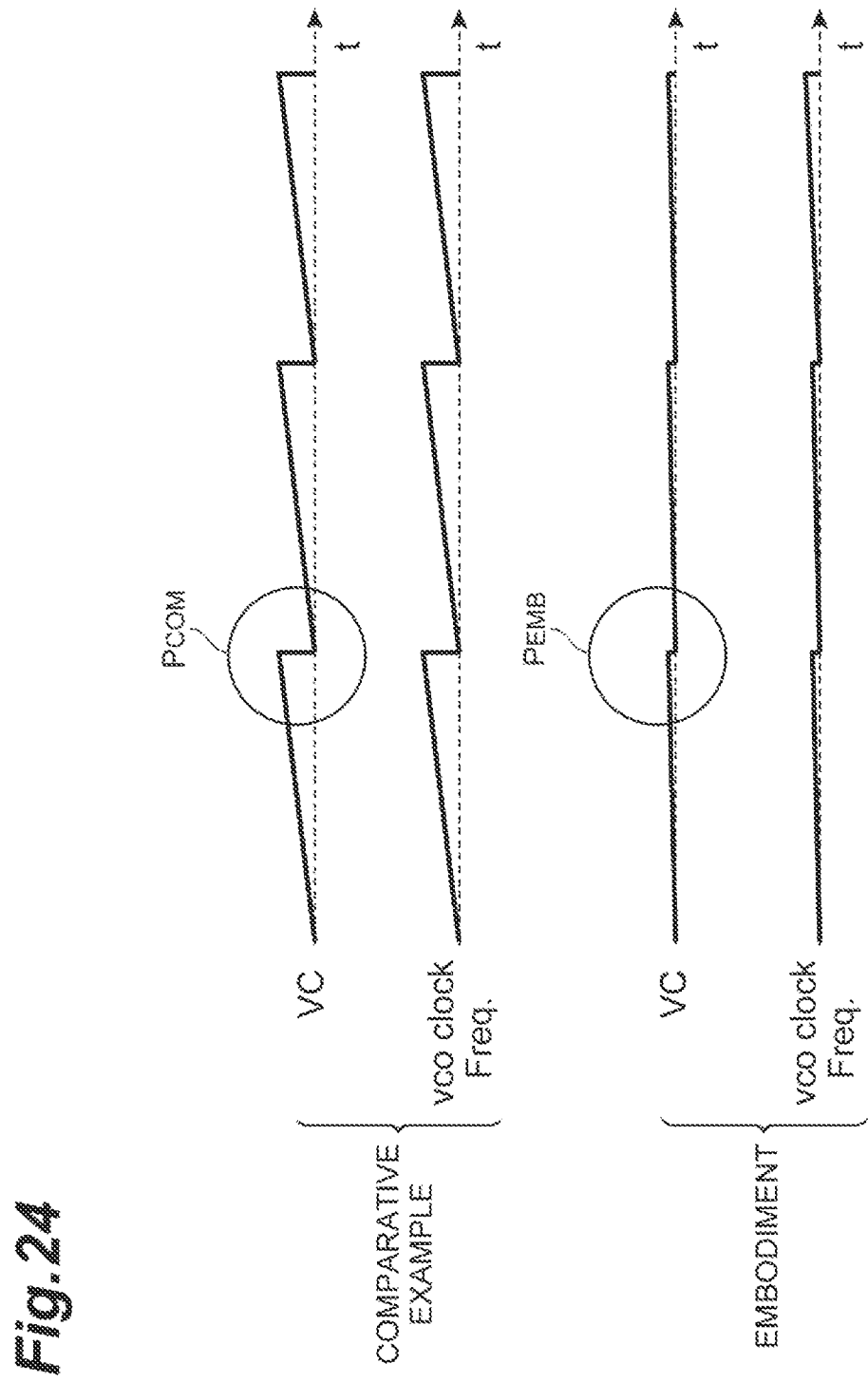
FIG. 24 is a diagram illustrating a temporal change in control voltage value VC and a frequency of an oscillation signal CLKout in a PLL circuit.

FIG. 24 is a diagram illustrating a temporal change in each of the control voltage value VC and a frequency of the oscillation signal CLKout in the PLL circuit. FIG. 24 illustrates a comparative example in which the detection circuit 48 and the compensation circuit 49 are not provided, and an embodiment in which the detection circuit 48 and the compensation circuit 49 are provided. By providing the detection circuit 48 and the compensation circuit 49, a fluctuation range of the control voltage value VC is small, and a fluctuation range of the frequency of the oscillation signal CLKout is also small.

In the embodiment, since a variable capacitive element of the replica is not necessary, a problem of the difference in the characteristics between the variable capacitive element of the LC-VCO and the variable capacitive element of the replica does not occur. In the embodiment, the performance deterioration due to the leak current of the variable capacitive element can be suppressed, and the increase in the layout area can be suppressed. It should be noted that the control voltage value VC changes due to the leak current. In the comparative example, as indicated by a region $P_{COM}$, when the control voltage value VC increases from an initial value, feedback for suppressing the increase is applied, and the control voltage VC returns to an original initial value. Further, in the embodiment, the amount of change of the control voltage value CV is small, and in particular, the amount of return of the control voltage value VC to the initial value through feedback is also small, as indicated by a region $P_{EMB}$.

Next, an embodiment of the PLL circuit will be described. In the PLL circuit of the embodiment, the voltage-controlled oscillator 40A (FIG. 5) or the voltage-controlled oscillator 40B (FIG. 6) is adopted as the voltage-controlled oscillator 40 in the PLL circuit 1 (FIG. 1). Further, in the voltage-controlled oscillator 40A (FIG. 5) or the voltage-controlled oscillator 40B (FIG. 6), any one of the first to fifteenth circuit examples (or a combination or modification example thereof) can be adopted as the detection circuit 48 and the compensation circuit 49. It is preferable for the PLL circuit of the embodiment to have a configuration illustrated in FIG. 25.

Figure 25:
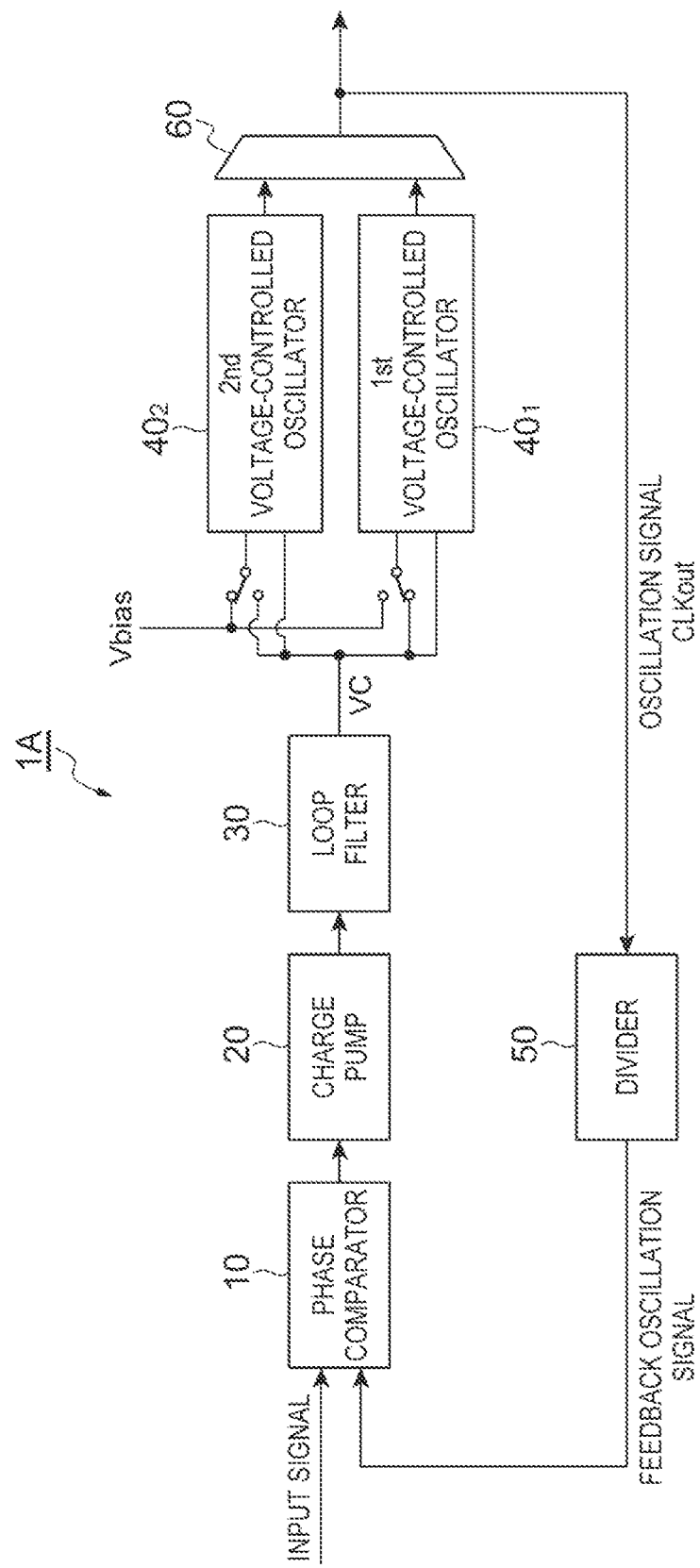
FIG. 25 is a diagram illustrating a configuration of a PLL circuit 1A.

FIG. 25 illustrates a configuration of the PLL circuit 1A. The PLL circuit 1A includes a phase comparator 10, a charge pump 20, a loop filter 30, voltage-controlled oscillators $40_1$ and $40_2$, a divider 50, and a selection unit 60. The PLL circuit 1A illustrated in FIG. 25 is different from the configuration of PLL circuit 1 illustrated in FIG. 1 in that a plurality of voltage-controlled oscillators (two voltage-controlled oscillators $40_1$ and $40_2$ in FIG. 25) are included instead of one voltage-controlled oscillator 40 and is further different in that a selection unit 60 is further included. Each of the voltage-controlled oscillators $40_1$ and $40_2$ has the same configuration as that of the voltage-controlled oscillator 40A (FIG. 5) or the voltage-controlled oscillator 40B (FIG. 6).

The respective voltage-controlled oscillators $40_1$ and $40_2$ have different relationships (FV characteristics) between the control voltage value VC and the frequency of the oscillation signal CLKout. The selection unit 60 selects an oscillation signal output from any one of the voltage-controlled oscillators $40_1$ and $40_2$ and outputs the selected oscillation signal to divider 50. Accordingly, a frequency range in which the PLL circuit 1A is operable can be expanded in the PLL circuit 1A, as compared with a case in which one voltage-controlled oscillator is provided.

The control voltage value VC input to the respective voltage-controlled oscillators $40_1$ and $40_2$ is common. Accordingly, since only one charge pump 20 and one loop filter 30 may be provided, it is possible to suppress an increase in circuit scale.

One of the voltage-controlled oscillators $40_1$ and $40_2$ becomes a use state, and the other becomes in a non-use state. The capacitance value of the variable capacitive element C1 of each of the voltage-controlled oscillators $40_1$ and $40_2$ is added to the capacitance value of the capacitive element 33 of the loop filter 30. In the voltage-controlled oscillator in a non-use state, when the bias voltage value Vbias applied to node N2 is smaller than the control voltage value VC applied to node N1, the amount of leak current of the variable capacitive element C1 becomes smaller and an influence on the loop filter 30 is small. However, the capacitance value of the variable capacitive element C1 fluctuates due to fluctuation in the control voltage value VC, and the fluctuation in the capacitance value of the variable capacitive element C1 influences on the capacitance value of the capacitive element 33 of the loop filter 30.

Therefore, in the voltage-controlled oscillator in the non-use state, it is preferable to suppress the fluctuation in the capacitance value of the variable capacitive element C1 by using the voltage value applied to the node N2 as the control voltage value VC instead of a constant bias voltage value Vbias. That is, it is preferable for each of the voltage-controlled oscillators $40_1$ and $40_2$ to include a switch that selects any one of the constant bias voltage value Vbias and the control voltage value VC as the voltage value applied to the node N2. The voltage-controlled oscillator in the use state selects the constant bias voltage value Vbias using the switch and applies the constant bias voltage value Vbias to the node N2. The voltage-controlled oscillator in the non-use state selects the control voltage value VC using the switch and applies the control voltage value VC to the node N2. Accordingly, in the voltage-controlled oscillator in the non-use state, the fluctuation in the capacitance value of the variable capacitive element C1 can be suppressed, and the leak current of the variable capacitive element C1 can be suppressed.

Figure 26:
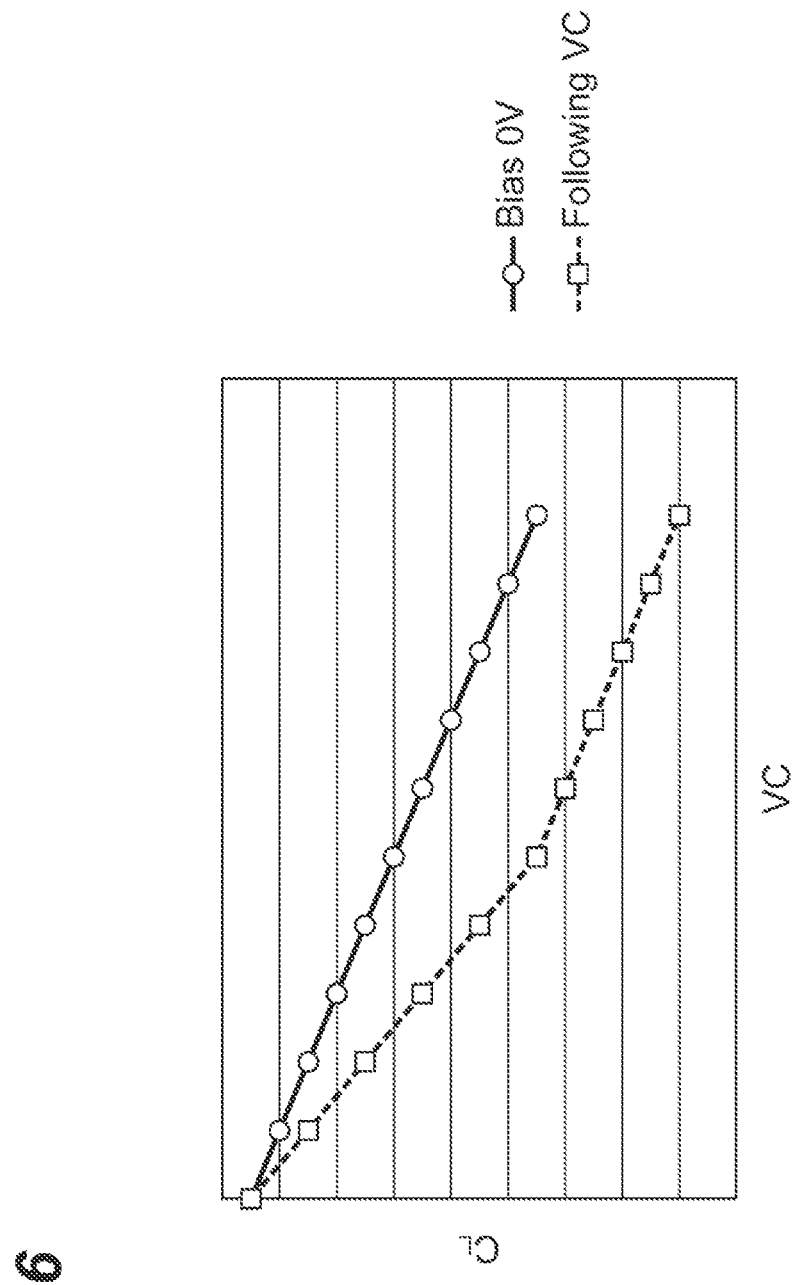
FIG. 26 is a graph illustrating a relationship between a capacitance value of a capacitive element 33 of a loop filter 30 to which a capacitance value of a variable capacitive element C1 of each of voltage-controlled oscillators $40_1$ and $40_2$ has been added, and a control voltage value VC.

FIG. 26 is a graph illustrating a relationship between a capacitance value $C_L$ of the capacitive element 33 of the loop filter 30 to which the capacitance value of the variable capacitive element C1 of each of the voltage-controlled oscillators $40_1$ and $40_2$ is added and the control voltage value VC. FIG. 26 illustrates a case in which a constant bias voltage value (0 V) is applied to the node N2 in the voltage-controlled oscillator in a non-use state (Bias 0 V), and a case in which the control voltage value VC is applied to the node N2 in the voltage-controlled oscillator in a non-use state (Bias Following VC). In the latter case, the fluctuation in the capacitance value of the capacitive element 33 of the loop filter 30 is smaller.

In a case in which the fluctuation in the capacitance value of the capacitive element 33 of the loop filter 30 is smaller, a variation in design parameters is small and design is facilitated. With such a configuration, it is possible to suppress the leak current of the variable capacitive element C1 in the voltage-controlled oscillator in the use state, to suppress the fluctuation in the capacitance value of the variable capacitive element C1 in the voltage-controlled oscillator in the non-use state, and to suppress the fluctuation in the capacitance value of the capacitive element 33 of the loop filter 30. Further, even when there is a leak current of the variable capacitive element C1 in the voltage-controlled oscillator in the non-use state, it is possible to compensate for the leak current.

Next, an embodiment of the CDR device will be described. The CDR device receives a digital signal (for example, coding data of 8B10B or 128B130B) in which a clock has been embedded, recovers data and clock on the basis of this digital signal, and outputs the recovered data and the recovered clock. The CDR device includes a PLL circuit and a sampler. In the CDR device, the sampler samples data of the digital signal at the timing indicated by the recovered clock, and outputs the sampled data as recovered data in synchronization with the recovered clock. The PLL circuit inputs the recovered data as an input signal to the phase comparator, outputs a recovered clock as an oscillation signal from the voltage-controlled oscillator, and applies the recovered clock to the sampler. The CDR device of the embodiment includes the PLL circuit of the embodiment described above. The CDR device of the embodiment preferably has a configuration illustrated in FIG. 27.

Figure 27:
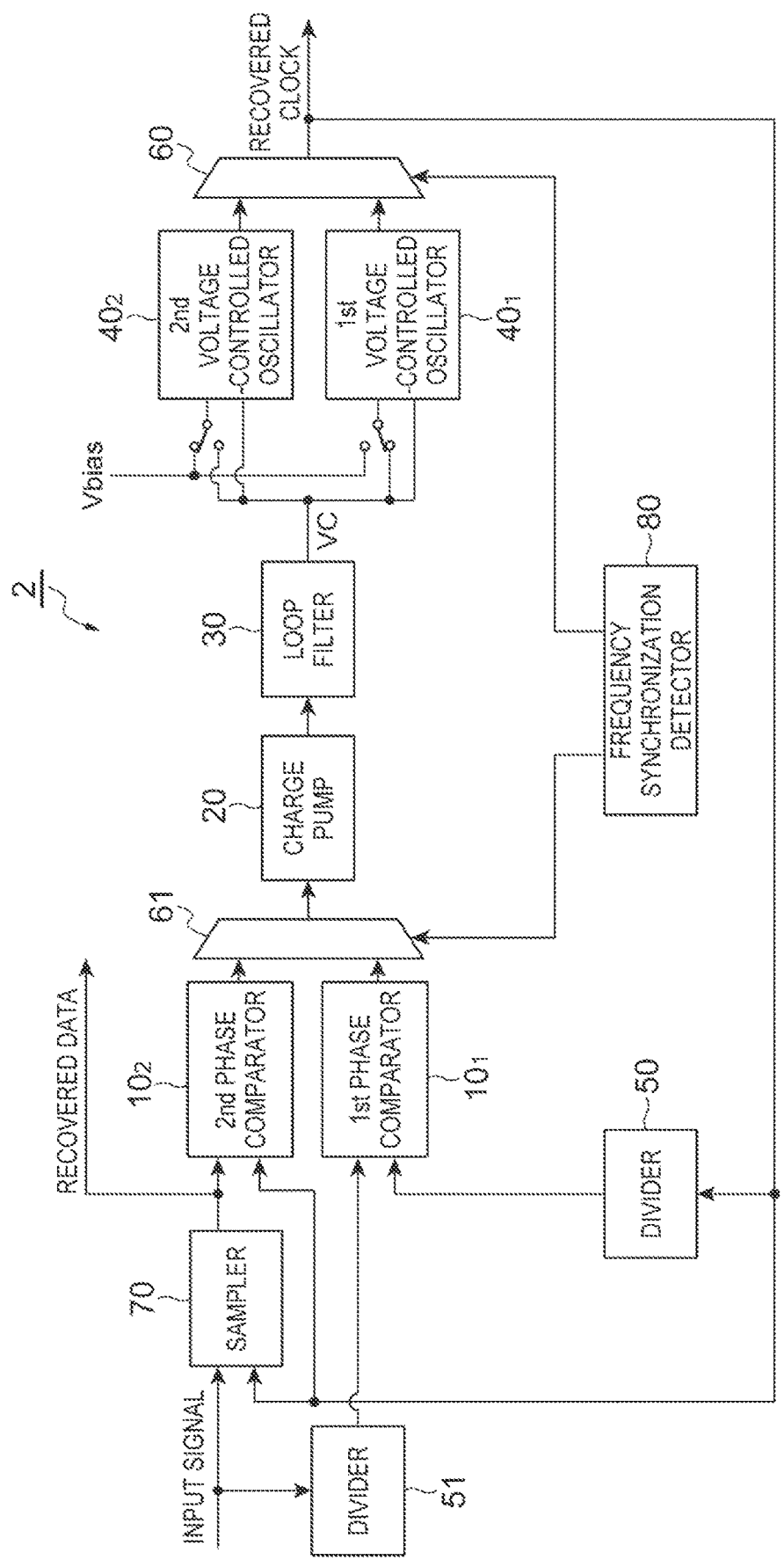
FIG. 27 is a diagram illustrating a configuration of a CDR device 2.

FIG. 27 is a diagram illustrating a configuration of the CDR device 2. The CDR device 2 includes phase comparators $10_1$ and $10_2$, a charge pump 20, a loop filter 30, voltage-controlled oscillators $40_1$ and $40_2$, dividers 50 and 51, selection units 60 and 61, a sampler 70, and a frequency synchronization detection unit 80. Among these, a loop including the phase comparator $10_1$, the charge pump 20, the loop filter 30, the voltage-controlled oscillator $40_1$, and the divider 50 constitutes a first PLL circuit. A loop including the phase comparator $10_2$, the charge pump 20, the loop filter 30, and the voltage-controlled oscillator $40_2$ constitutes a second PLL circuit. In the first and second PLL circuits, the charge pump 20 and the loop filter 30 are provided in common. The second PLL circuit does not include a divider.

The sampler 70 receives the digital signal in which the clock has been embedded, and receives the oscillation signal (recovered clock) selected and output by the selection unit 60. The sampler 70 samples the data of the digital signal at a timing indicated by the recovered clock, and outputs the sampled data as recovered data to the phase comparator $10_2$ in synchronization with the recovered clock.

The phase comparator $10_2$ receives the recovered data from the sampler 70 and receives the oscillation signal (recovered clock) selected and output by the selection unit 60. The phase comparator $10_2$ detects a phase difference between the recovered clock and the recovered data, and outputs a phase difference signal indicating the phase difference to the selection unit 61. The phase comparator $10_2$ is preferably of a Bang-Bang type.

When the input signal is data with a repetitive pattern at a constant period such as 101010 . . . , the divider 51 divides the input signal to generate a reference clock and outputs the reference clock to the phase comparator $10_1$.

The phase comparator $10_1$ receives the reference clock generated by the divider 51 dividing the input signal, and receives the feedback oscillation signal output from the divider 50. The phase comparator $10_1$, detects a phase difference between the feedback oscillation signal and the reference clock, and outputs a phase difference signal indicating the phase difference to the selection unit 61.

The frequency synchronization detection unit 80 detects whether or not a frequency is synchronized between the feedback oscillation signal input to the phase comparator $10_1$ and the reference clock.

In a first period in which frequency synchronization is not detected by the frequency synchronization detection unit 80, the selection unit 61 selects the phase difference signal output from the phase comparator $10_1$ that receives the reference oscillation signal as an input signal, and outputs the phase difference signal to the charge pump 20. Further, in the first period, the selection unit 60 selects and outputs the oscillation signal output from the voltage-controlled oscillator $40_1$ among the voltage-controlled oscillators $40_1$ and $40_2$.

In a second period in which frequency synchronization is detected by the frequency synchronization detection unit 80, the selection unit 61 selects the phase difference signal output from the phase comparator $10_2$ that receives the recovered data as an input signal, and outputs the phase difference signal to the charge pump 20. Further, in the second period, the selection unit 60 selects and outputs the oscillation signal output from the voltage-controlled oscillator $40_2$ among the voltage-controlled oscillators $40_1$ and $40_2$.

In the CDR device 2, in the first period in which the frequency synchronization is not established, the first PLL circuit including the phase comparator $10_1$ receiving the reference clock output from the divider 51 and the voltage-controlled oscillator $40_1$ operates. On the other hand, in the second period in which the frequency synchronization is established, the second PLL circuit including the phase comparator $10_2$ receiving the recovered data output from the sampler 70 and the voltage-controlled oscillator $40_2$ operates. Therefore, the operation of the first PLL circuit using the reference clock can be stabilized in a short time, and recovery of the data and the clock based on the input digital signal can be started early.

In the PLL circuit and the CDR device of the embodiment, it is possible to suppress the performance deterioration due to the leak current of the variable capacitive element C1 by the voltage-controlled oscillators $40_1$ and $40_2$ having the above-described configuration.

As described above, there is provided a voltage-controlled oscillator in which the above-described LC-VCO includes a control voltage input terminal (a node N1) to which the control voltage value (VC) is input, first and second output terminals (terminals from which the CLKout is output), and a power supply potential supply terminal (a node between the inductor 44 and the inductor 45), for example, referring to FIG. 5, the voltage-controlled oscillator including a first inductor (44) including one terminal connected to the power supply potential supply terminal and the other terminal (a node N3) connected to the first output terminal (one of the terminals of CLKout), a second inductor (45) including one terminal connected to the power supply potential supply terminal and the other terminal connected to the second output terminal (the other of the terminals of CLKout), a first variable capacitor (C1: included in 41A) and a first capacitor (C2: included in 41A) connected in series between the control voltage input terminal (the node N1) and the other terminal (the node N3) of the first inductor (44), a second variable capacitor (C1: included in 42A) and a second capacitor (C2: included in 42A) connected in series between the control voltage input terminal (the node N1) and the other terminal (the node N3) of the second inductor (45), a first current detector (the detection circuit 48: included in 41A) connected between a node (N2) between the first variable capacitor (C1: included in 41A) and the first capacitor (C2: included in 41A) and a bias input terminal (Vbias), and a first feedback compensator (the compensation circuit 49: included in 41A) connected between an output terminal of the first current detector (detection circuit 48: included in 41A) and the control voltage input terminal (the node N1).

In the configuration of FIG. 5, the voltage-controlled oscillator includes a second current detector (a detection circuit 48: included in 42A) connected between a node (N2) between the second variable capacitor (C1: included in 42A) and the second capacitor (C2: included in 42A) and the bias input terminal (Vbias), and a second feedback compensator (the compensation circuit 49: included in 42A) connected between an output terminal of the second current detector (the detection circuit 48: included in 42A) and the control voltage input terminal (the node N1).

It should be noted that in the configuration of FIG. 6, a common current detector and a common feedback compensator are used. In this case, in the voltage-controlled oscillator, the first current detector (the detection circuit 48: common) is also connected between the node (N2) between the second variable capacitor (C1: included in 42B) and the second capacitor (C2: included in 42BA) and the bias input terminal (Vbias).

What is claimed is:

1. A voltage-controlled oscillator comprising an inductor, a first capacitive circuit, and a second capacitive circuit, and outputting an oscillation signal having a frequency according to an input control voltage value due to a resonance phenomenon of the inductor, the first capacitive circuit, and the second capacitive circuit, wherein each of the first capacitive circuit and the second capacitive circuit includes a variable capacitive element provided between a node N1 and a node N2 and having a capacitance value according to a voltage value between the nodes N1 and N2;

a capacitive element provided between the node N2 and a node N3;

a detection circuit that applies a bias voltage value to the node N2 and detects an amount of leak current flowing through the variable capacitive element; and a compensation circuit that causes a current for compensating for the leak current to flow through the node N1 on the basis of a detection result of the detection circuit, wherein the inductor is provided between the nodes N3 of the first capacitive circuit and the second capacitive circuit, and the nodes N1 of the first capacitive circuit and the second capacitive circuit are electrically connected to each other to receive the control voltage value wherein the detection circuit includes a MOS transistor M1 of which a source is connected to a first potential supply terminal, a resistive unit provided between a drain of the MOS transistor M1 and the node N2, and a differential amplifier including a first input terminal connected to the drain of the MOS transistor M1, a second input terminal to which a bias voltage value is input, and an output terminal connected to a gate of the MOS transistor M1, and the compensation circuit includes a MOS transistor M2 of which a source is connected to the first potential supply terminal and a gate is connected to the output terminal of the differential amplifier, a MOS transistor M3 provided between a second potential supply terminal and a drain of the MOS transistor M2, and a MOS transistor M4 that is provided between the second potential supply terminal and the node N1, that forms a current mirror circuit together with the MOS transistor M3, and through which a current of the same amount as a current flowing through the MOS transistor M3 flows.

2. The voltage-controlled oscillator according to claim 1, wherein the detection circuit further includes a first current source provided between the second potential supply terminal and the drain of the MOS transistor M1.

3. The voltage-controlled oscillator according to claim 2, wherein the compensation circuit further includes a third current source provided between the first potential supply terminal and the node N1.

4. The voltage-controlled oscillator according to claim 2, wherein the compensation circuit further includes a fourth current source provided between the second potential supply terminal and a gate of each of the MOS transistor M3 and the MOS transistor M4.

5. The voltage-controlled oscillator according to claim 1, wherein the detection circuit further includes a second current source provided between the second potential supply terminal and the node N2.

6. A PLL circuit comprising:
the voltage-controlled oscillator according to claim 1, which outputs an oscillation signal having a frequency according to an input control voltage value,
a phase comparator that receives an oscillation signal output from the voltage-controlled oscillator or a signal obtained by dividing the oscillation signal as a feedback oscillation signal, also receives an input signal, detects a phase difference between the feedback oscillation signal and the input signal, and outputs a phase difference signal indicating this phase difference,
a charge pump that receives a phase difference signal output from the phase comparator and outputs a charge/discharge current according to the phase difference indicated by the phase difference signal, and
a loop filter that receives a charge/discharge current output from the charge pump and outputs the control voltage value that is increased/decreased according to a charge/discharge amount thereof to the voltage-controlled oscillator.

7. The PLL circuit according to claim 6, further comprising:
a plurality of voltage-controlled oscillators as the voltage-controlled oscillator, and
a selection unit that selects and outputs an oscillation signal output from any one of the plurality of voltage-controlled oscillators.

8. The PLL circuit according to claim 7,
wherein the voltage-controlled oscillator other than the voltage-controlled oscillator selected from among the plurality of voltage-controlled oscillators by the selection unit receives the control voltage value instead of a bias voltage value.

9. A voltage-controlled oscillator comprising an inductor, a first capacitive circuit, and a second capacitive circuit, and outputting an oscillation signal having a frequency according to an input control voltage value due to a resonance phenomenon of the inductor, the first capacitive circuit, and the second capacitive circuit,
wherein each of the first capacitive circuit and the second capacitive circuit includes
a variable capacitive element provided between a node N1 and a node N2 and having a capacitance value according to a voltage value between the nodes N1 and N2;
a capacitive element provided between the node N2 and a node N3;
a detection circuit that applies a bias voltage value to the node N2 and detects an amount of leak current flowing through the variable capacitive element; and
a compensation circuit that causes a current for compensating for the leak current to flow through the node N1 on the basis of a detection result of the detection circuit,
wherein the inductor is provided between the nodes N3 of the first capacitive circuit and the second capacitive circuit, and
the nodes N1 of the first capacitive circuit and the second capacitive circuit are electrically connected to each other to receive the control voltage value
wherein the detection circuit includes
a MOS transistor M11 of which a source is connected to a first potential supply terminal,
a MOS transistor M21 of which a source is connected to a second potential supply terminal,
a resistive unit provided between a drain of each of the MOS transistor M11 and the MOS transistor M21 and the node N2,
a differential amplifier including a first input terminal connected to the drain of each of the MOS transistor M11 and the MOS transistor M21, a second input terminal to which a bias voltage value is input, and an output terminal connected to a gate of each of the MOS transistor M11 and the MOS transistor M21, and
the compensation circuit includes
a MOS transistor M12 of which a source is connected to the first potential supply terminal and a gate is connected to the output terminal of the differential amplifier,
a MOS transistor M13 provided between the second potential supply terminal and a drain of the MOS transistor M12,
a MOS transistor M14 that is provided between the second potential supply terminal and the node N1, that constitutes a current mirror circuit together with the MOS transistor M13, and through which a current of the same amount as a current flowing through the MOS transistor M13 flows, a MOS transistor M22 of which a source is connected to the second potential supply terminal and a gate is connected to the output terminal of the differential amplifier, a MOS transistor M23 provided between the first potential supply terminal and a drain of the MOS transistor M22, and a MOS transistor M24 that is provided between the first potential supply terminal and the node N1, that constitutes a current mirror circuit together with the MOS transistor M23, and through which a current of the same amount as a current flowing through the MOS transistor M23 flows.

10. The voltage-controlled oscillator according to claim 1, wherein the detection circuit includes, as the resistive unit, a MOS transistor M5 having a resistance value corresponding to a gate voltage.

11. A CDR device that receives a digital signal in which a clock has been embedded, recovers data and the clock on the basis of the digital signal, and outputs the recovered data and the recovered clock, the CDR device comprising:
  a sampler that samples data of the digital signal at a timing indicated by the recovered clock, and outputs the sampled data as the recovered data in synchronization with the recovered clock; and
  the PLL circuit according to claim 6 that inputs the recovered data to the phase comparator as an input signal, outputs the recovered clock from the voltage-controlled oscillator as the oscillation signal, and applies the recovered clock to the sampler.

12. A capacitive circuit comprising:
  a variable capacitive element provided between a node N1 and a node N2 and having a capacitance value according to a voltage value between the nodes N1 and N2;
  a capacitive element provided between the node N2 and a node N3;
  a detection circuit including:
  a MOS transistor M1 of which a source is connected to a first potential supply terminal,
  a resistive unit provided between a drain of the MOS transistor M1 and the node N2, and
  a differential amplifier including a first input terminal connected to the drain of the MOS transistor M1, a second input terminal to which a bias voltage value is input, and an output terminal connected to a gate of the MOS transistor M1; and
  a compensation circuit including:
  a MOS transistor M2 of which a source is connected to the first potential supply terminal and a gate is connected to the output terminal of the differential amplifier,
  a MOS transistor M3 provided between a second potential supply terminal and a drain of the MOS transistor M2, and
  a MOS transistor M4 that is provided between the second potential supply terminal and the node N1, that forms a current mirror circuit together with the MOS transistor M3, and through which a current of the same amount as a current flowing through the MOS transistor M3 flows.

13. A voltage-controlled oscillator including a control voltage input terminal, first and second output terminals, and a power supply potential supply terminal, the voltage-controlled oscillator comprising:
  a first inductor including one terminal connected to the power supply potential supply terminal and the other terminal connected to the first output terminal;
  a second inductor including one terminal connected to the power supply potential supply terminal and the other terminal connected to the second output terminal;
  a first variable capacitor and a first capacitor connected in series between the control voltage input terminal and the other terminal of the first inductor;
  a second variable capacitor and a second capacitor connected in series between the control voltage input terminal and the other terminal of the second inductor;
  a first current detector connected between a node between the first variable capacitor and the first capacitor and a bias input terminal; and
  a first feedback compensator connected between an output terminal of the first current detector and the control voltage input terminal, the first feedback compensator providing a current to the control voltage input terminal based on an amount of a leak current of the first variable capacitor detected by the first current detector.

14. The voltage-controlled oscillator according to claim 13, further comprising:
  a second current detector connected between a node between the second variable capacitor and the second capacitor and the bias input terminal; and
  a second feedback compensator connected between an output terminal of the second current detector and the control voltage input terminal, the second feedback compensator providing a current to the control voltage input terminal based on an amount of a leak current of the second variable capacitor detected by the second current detector.

15. The voltage-controlled oscillator according to claim 13, wherein the first current detector is connected between a node between the second variable capacitor and the second capacitor and the bias input terminal.

16. A capacitive circuit comprising:
  a variable capacitive element provided between a node N1 and a node N2 and having a capacitance value according to a voltage value between the nodes N1 and N2;
  a capacitive element provided between the node N2 and a node N3;
  a detection circuit including:
  a MOS transistor M11 of which a source is connected to a first potential supply terminal,
  a MOS transistor M21 of which a source is connected to a second potential supply terminal,
  a resistive unit provided between a drain of each of the MOS transistor M11 and the MOS transistor M21 and the node N2,
  a differential amplifier including a first input terminal connected to the drain of each of the MOS transistor M11 and the MOS transistor M21, a second input terminal to which a bias voltage value is input, and an output terminal connected to a gate of each of the MOS transistor M11 and the MOS transistor M21; and
  compensation circuit including:
  the compensation circuit includes
  a MOS transistor M12 of which a source is connected to the first potential supply terminal and a gate is connected to the output terminal of the differential amplifier,
  a MOS transistor M13 provided between the second potential supply terminal and a drain of the MOS transistor M12,
  a MOS transistor M14 that is provided between the second potential supply terminal and the node N1, that constitutes a current mirror circuit together with the MOS transistor M13, and through which a current of the same amount as a current flowing through the MOS transistor M13 flows, a MOS transistor M22 of which a source is connected to the second potential supply terminal and a gate is connected to the output terminal of the differential amplifier, a MOS transistor M23 provided between the first potential supply terminal and a drain of the MOS transistor M22, and a MOS transistor M24 that is provided between the first potential supply terminal and the node N1, that constitutes a current mirror circuit together with the MOS transistor M23, and through which a current of the same amount as a current flowing through the MOS transistor M23 flows.

* * * * *